(12) United States Patent
Tsatsanis et al.

(10) Patent No.: US 8,326,906 B2
(45) Date of Patent: Dec. 4, 2012

(54) EFFICIENT MULTIPLE INPUT MULTIPLE OUTPUT SIGNAL PROCESSING METHOD AND APPARATUS

(75) Inventors: Michail Konstantinos Tsatsanis, Huntington Beach, CA (US); Willen Lao, Foothill Ranch, CA (US); Wei Mo, Mission Viejo, CA (US)

(73) Assignee: Positron Access Solutions, Inc., Montreal (CA)

( * ) Notice: Subject to any disclaimer, the term of this patent is extended or adjusted under 35 U.S.C. 154(b) by 1350 days.

(21) Appl. No.: 12/011,486

(22) Filed: Jan. 25, 2008

(65) Prior Publication Data

US 2008/0215650 A1 Sep. 4, 2008

Related U.S. Application Data

(60) Provisional application No. 60/897,642, filed on Jan. 25, 2007.

(51) Int. Cl.
*G06F 17/10* (2006.01)
(52) U.S. Cl. ........................................ 708/321; 708/308
(58) Field of Classification Search .................. 708/308, 708/321
See application file for complete search history.

(56) References Cited

U.S. PATENT DOCUMENTS

| | | | |
|---|---|---|---|
| 5,285,474 A | | 2/1994 | Chow et al. |
| 5,479,447 A | | 12/1995 | Chow et al. |
| 5,627,896 A | * | 5/1997 | Southward et al. ........ 381/71.11 |
| 5,636,153 A | * | 6/1997 | Ikegaya et al. .............. 708/490 |
| 5,673,290 A | | 9/1997 | Cioffi |
| 5,887,032 A | | 3/1999 | Cioffi |
| 6,252,901 B1 | | 6/2001 | Mueller et al. |
| 6,345,071 B1 | | 2/2002 | Hamdi |
| 6,520,744 B1 | | 2/2003 | Verbin et al. |
| 6,567,464 B2 | | 5/2003 | Hamdi |
| 6,587,502 B1 | | 7/2003 | Hendrichs et al. |
| 6,711,207 B1 | | 3/2004 | Amrany et al. |
| 2001/0048667 A1 | | 12/2001 | Hamdi |
| 2003/0026282 A1 | | 2/2003 | Gross et al. |
| 2003/0081759 A1 | | 5/2003 | Harris |
| 2003/0086362 A1 | | 5/2003 | Hasegawa et al. |
| 2003/0123487 A1 | | 7/2003 | Blackwell et al. |
| 2004/0085987 A1 | | 5/2004 | Gross et al. |
| 2004/0105465 A1 | | 6/2004 | Gross et al. |

(Continued)

FOREIGN PATENT DOCUMENTS

WO    WO 03/105339    12/2003

(Continued)

OTHER PUBLICATIONS

Eric W. Weisstein, "Eric Weisstein's World of Mathematics—Diagonal Matrix", © 1999 CRC Press LLC, © 1999-2003 *Wolfram Research, Inc.*, 2 pages.

(Continued)

*Primary Examiner* — Chuong D Ngo
(74) *Attorney, Agent, or Firm* — Weide & Miller, Ltd.

(57) ABSTRACT

A method and apparatus are disclosed for use with multiple input, multiple output (MIMO) signal processing techniques, which reduce the amount of memory and memory bandwidth used to store and access filter coefficients by compressing a filter coefficient based at least in part on one or more neighboring filter coefficients for storage and decompressing the filter coefficients when retrieved. The decompressed filter coefficients can be used with a MIMO filtering technique, and/or can be used to compress or decompress additional coefficients.

26 Claims, 17 Drawing Sheets

U.S. PATENT DOCUMENTS

2004/0223511 A1    11/2004    Tzannes

FOREIGN PATENT DOCUMENTS

WO        WO 03/105352        12/2003

OTHER PUBLICATIONS

Steffen Trautmann, et al., "A New Equalizer for Multitone Systems Without Guard Time", *IEEE Communications Letters*, vol. 6, No. 1, Jan. 2002, pp. 34-36.

Jeffrey Wu, et al., "Efficient Matrix Multiplication Methods to Implement a Near-optimum Channel Shortening Method for DMT Transceivers", The University o Texas at Austin, Asilomar Conference, Oct. 30, 2000, 14 pages.

J. Cioffi, "Digital Duplexing: VDSL Performance Improvement by Aversion of Frequency Guard Bands (TD13)", ETSI TM6 Endinburgh, Sep. 20-24, 1999, pp. 1-16.

Lei Wang, et al., "Low-Power AEC-Based MIMO Signal Processing for Gigabit Ethernet 1000Base-T Transceivers", Copyright 2001, ACM 1-58113-371-5/01/0008, pp. 334-339.

Arthur Redfern, et al., "Expanding the Reach of ADSL", http://www.commsdesign.com/story.OEG20030717S0028, Jul. 17, 2003, 2 pages.

* cited by examiner

EFFICIENT MULTIPLE INPUT MULTIPLE OUTPUT SIGNAL PROCESSING METHOD AND APPARATUS

PRIORITY CLAIM

This application claims priority to and the benefit of U.S. provisional application No. 60/897,642 filed on Jan. 25, 2007 entitled Efficient Multiple Input Multiple Output Signal Processing Method & Apparatus

FIELD OF THE INVENTION

The invention relates to multichannel data transmission systems and removal of interference, e.g., crosstalk, in a multichannel communication system, and more particularly to a method and apparatus for storage and retrieval of coefficients used in the removal of interference in a multichannel communication system.

RELATED ART

It is commonly accepted practice to transmit data between remote locations over some form of transmission medium. The growing popularity of electronic data exchange is increasing the demand for high rate data transmit speeds between remote locations. Multichannel communication systems have found application in may situations it is desirable to increase the rate of data exchange. The use of multiple channels often increases the effective transmit rate over a single channel system. Examples include wireless communication systems with multiple transmit and multiple receive antennas, DSL systems with multiple copper pairs and Ethernet systems (using four copper pairs per link). We should point out here that the term "multichannel" in this context refers to multiple physical transmission paths as in the case of multi-antenna or multi-copper pair transmission systems, which typically interfere with each other. It does not refer to transmission onto multiple carriers or frequency bands (e.g., OFDM and DMT systems) in a single antenna or single pair system. Typically, in these multi-carrier transmission systems the different frequency channels do not appreciably interfere with each other.

In those examples of multiple physical transmission systems, information is transmitted in a coordinated fashion across the multiple channels to utilize all of the channels of the physical transmission medium. Further, coordinated multichannel signaling can be utilized in applications where a point-to-multipoint communication link is desired. One example is the case where a wireless base station communicates with multiple mobile transceivers. Another example includes the case of DSL access multiplexers in a telephone central office communicating with multiple customer DSL modems in a star network using one pair per customer.

As a drawback to these prior art systems, interference is often a major degradation factor limiting the performance of communication systems. In the single channel transmission systems, intersymbol interference (ISI) is a major impairment and modern transceivers employ a variety of techniques to mitigate it (channel equalization). In multichannel communication systems there is further interference due to interactions across the communication channels. This interaction across communication channels is often referred to as crosstalk. For example, in wireline communications crosstalk is generated due to electromagnetic coupling when copper pairs travel in close proximity for long distances, or even short distances depending on the relative signal strengths. In wireless communications, crosstalk is generated when multiple users transmit signals whose energy partially overlaps in frequency and/or time.

Crosstalk is classified as near end (NEXT) or far end (FEXT) crosstalk depending on the location of the aggressor transmitter, i.e., whether the aggressor transmitter is at the near end or the far end in reference to the victim receiver. Furthermore, in the context of a multichannel system, crosstalk is often classified as self or alien crosstalk. Self crosstalk originates from the transmitters which are part of the coordinated multichannel transceiver. Alien crosstalk originates from the transmitters which are not part of the coordinated multichannel transceiver. Alien crosstalk can be particularly troublesome because it originates from other transmitters or channels (e.g., legacy systems) that are not part of the system under design and to which the system under design does not have access to for purposes of crosstalk cancellation.

Typically, filtering can be used to negate crosstalk, or other interference. Such filtering can be performed in the frequency domain on each frequency subchannel (e.g., DMT or OFDM frequency bin). Multiple Input Multiple Output (MIMO) filtering involves processing data across lines or channels per frequency bin. This approach, significantly reduces the computational requirements (compared to performing MIMO filtering in the time domain using time domain filters). However, it requires separate filtering coefficients for each frequency bin. These filtering coefficients must be stored and repeatedly accessed during the filtering process on a bin-by-bin basis. Improvements are therefore needed in the storage and access of filtering coefficients.

In particular, the computational complexity and coefficient storage requirements grow with the square of the number of channels N (copper pairs or antennas) since most MIMO architectures involve matrix filtering of size N-by-N. In a multicarrier transmission system, such operations have to be repeated for each carrier. This translates into significant implementation obstacles once the number of channels grows beyond 2 or 4, and as the number of carriers grows to a large value. For DSL applications as an example, where MIMO sizes of 8, 16 or 24 channels are envisioned and the number of carrier frequencies can be up to 4096, the implementation complexity becomes particularly intractable.

SUMMARY

To overcome the drawbacks of the prior art, the method and apparatus described herein provides efficiencies in storing and accessing filtering coefficients for use in MIMO filtering to remove crosstalk, and/or other interference, in multichannel transmission systems. It is contemplated that any multichannel environment may benefit from the method and apparatus described herein including, but not limited to, twisted copper, coax cable, fiber optic, free space, wireless, or any other metallic or multichannel medium.

In accordance with the method and apparatus disclosed herein, a method is provided for storing filter coefficients for use with a multiple input, multiple output filter comprising storing a first set of coefficients in memory, the first set corresponding to a first frequency bin, compressing a second set of coefficients corresponding to a second frequency bin, wherein compression of the second set of coefficients is based at least in part on the first set of coefficients, and storing the second set of coefficients.

Also disclosed is a method for accessing filter coefficients for use with a multiple input, multiple output filter comprising retrieving a first set of coefficients from memory, retrieving a second set of coefficients from memory, wherein the second set of coefficients are stored in a compressed form, decompressing the second set of coefficients based at least in part on the first and second sets of coefficients.

Also disclosed is a method for filtering using a multiple input, multiple output filter comprising retrieving a set of prediction error values, each of which corresponds to a filter coefficient for use in filtering a set of input signals in the frequency domain, generating a set of filter coefficients using the retrieved prediction error values, and filtering the input signals using the generated set of filter coefficients.

Also disclosed is a system for storing filter coefficients for use with a multiple input, multiple output filter comprising a storage subsystem storing a first set of coefficients in memory, the first set corresponding to a first frequency bin, and an interface coupled to the storage subsystem configured to compress a second set of coefficients corresponding to a second frequency bin, wherein compression of the second set of coefficients is based at least in part on the first set of coefficients, and wherein the second set of coefficients are stored by the storage subsystem.

In another embodiment, a system is provided for accessing filter coefficients for use with a multiple input, multiple output filter, the system comprises a storage subsystem comprising a memory storing first and second sets of coefficients, the second set of coefficients being stored in a compressed form, and a filtering, subsystem. The filtering subsystem comprises an interface configured to retrieve the first and second sets of coefficients from memory, and decompress the second set of coefficients based at least in part on the first and second sets of coefficients.

In another embodiment, a system is provided for multiple input, multiple output filtering using coefficients, the system comprising storage and filtering subsystems. The storage subsystem comprises a memory configured to store a set of coefficient prediction error values, each of which corresponds to a filter coefficient for use in filtering a set of input signals in the frequency domain. The filtering subsystem is coupled to the storage subsystem and comprises an interface configured to retrieve the coefficient prediction error values from memory and to generate a set of filter coefficients using the retrieved coefficient prediction error values. In this manner, the filtering subsystem is configured to filter the input signals using the generated set of filter coefficients.

This embodiment teaches how sets of coefficients, corresponding to sets of frequency carriers can be efficiently stored and retrieved, by using prediction of the coefficients for a particular frequency carrier from the coefficients used for neighboring frequency carriers. It is stressed here that the term prediction refers to predicting the coefficient values used in a particular carrier; it does not refer to predicting the actual signal values and in fact it is not limited to prediction error filter structures. The current subject matter is in fact agnostic to the specific architecture of the MIMO filter and is applicable to several MIMO architectures including but not limited to linear filtering, decision feedback filtering, and transmitter precompensation filtering.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

FIG. 6, which comprises

FIG. 7, which comprises

DETAILED DESCRIPTION

Figure 1:
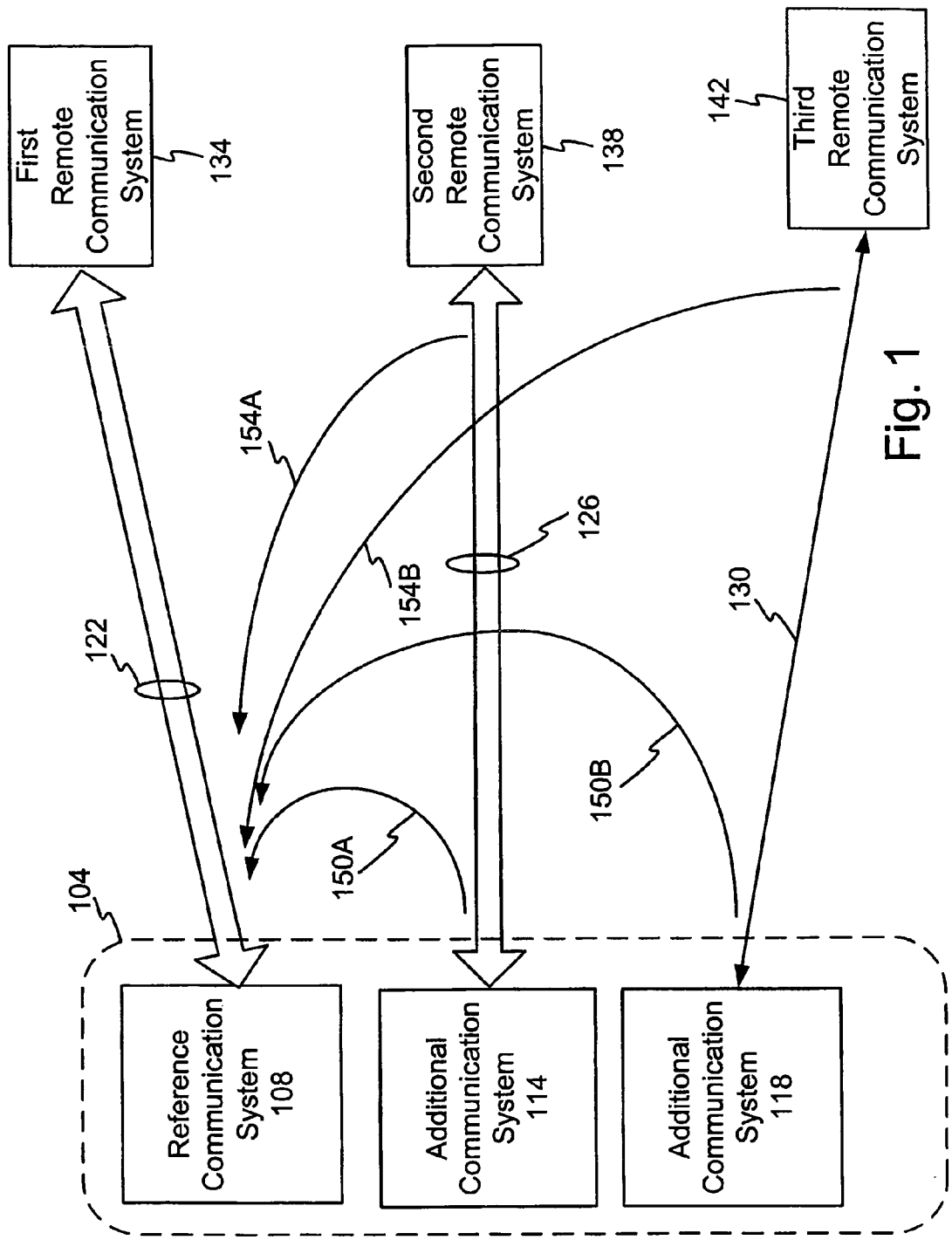
FIG. 1 illustrates a block diagram of an example environment of use of the method and apparatus described herein.

Before discussing the particulars of the claimed method and apparatus, a discussion of example environments for use of the invention may aid the reader in their understanding. FIG. 1 illustrates an example environment of use in accordance with one or more embodiments of the present disclosure. FIG. 1 is provided by way of a non-limiting example, and the embodiments disclosed herein should not be limited to environments of use shown in FIG. 1. As shown a plurality of communication systems or stations is shown, each of which communicates over one or more channels. In particular, located at a first location 104, such as a central office or internet service provider, is a reference communication system 108. In addition, one or more additional communications systems 114, 118 may also be located at the first location 104. The term reference communication system 108 is defined to mean the communications system under design or from which crosstalk analysis occurs. It is contemplated that the communication systems 108, 114, 118 at the first location may communicate with one or more remote locations 134, 138, 142, respectively.

In the example shown in FIG. 1, the reference communication system 108 communicates with the first remote communication system 134 over a; multiple channel communication path 122, which may be referred to as the reference channel as it is associated with the reference communication system. Use of the multiple channel communication path 122 allows increased bandwidth over single channel systems. Similarly, the additional communication system 114 communicates; with the second remote communication system 138 via a multiple channel communication path 122 while the additional communication system 118 communicates over with the third remote communication system 142 via a single channel communication path 130. The channel discussed herein may comprise any type of signal path such as but not limited to channel twisted pair metallic conductors, wireless, optical, coax, etc. An example of wireline multichannel system is a Gig-Ethernet transmission system over four copper pairs. Another example is a DSL multipair system. Further, an example of a wireless multichannel system may be a system with multiple transmit and receive antennas or a system that transmits over multiple frequency bands.

As can be appreciated, although the remote communication systems 134, 138, 142 may be located at diverse locations, the channels 122, 126, 130 may be in close proximity for at least a portion of the distance of the channel(s). Moreover, since the communication systems 108, 114, 118 are all located at the first location 104, it is contemplated that the channels 122, 126, 130 will be in close proximity for at least the distance near the first location, such as for example in the case of twisted pair entering the central office via a common bundle of twisted pair copper cable.

Due to the proximity of the channels 122, 126, 130 it is anticipated the crosstalk will exist on the reference channel 122 due to coupling of the signals on channels 126, 130 onto the reference channel. Such crosstalk is shown in FIG. 1 as alien near end cross talk (NEXT) 150A, 150B and alien far end cross talk (FEXT) 154A, 154B. As is understood by one of ordinary skill in the art the term alien crosstalk signifies that the crosstalk is generated by channel(s) other than those in the one or more channels that comprise the reference channel(s). Although not shown, it is contemplated that the reference channel, being comprised of two or more individual channels or conductors, will also generate crosstalk, which is referred to herein as self crosstalk, due to the proximity of the two or more conductors that comprise the two or more channels 122. Those of ordinary skill in the art understand the nature of self crosstalk and the associated drawbacks and hence it is not described in detail herein.

In one example embodiment the reference communication system 108 and the first remote communication system 134 comprise communication systems configured to operate in accordance with a DSL standard utilizing two or more channels in an effort to maximize the data transmit rate utilizing presently existing twisted pair conductors. In this manner the benefits of presently installed cabling may be realized while also maximizing bandwidth between communication systems. In one embodiment the channel 122 comprises six to fourteen twisted pair conductors, although in other embodiments any number of conductors or conductor pairs may be utilized to gain the benefits of the method and apparatus described herein. In addition, communication standards other than DSL may be adopted for use with the method and apparatus described herein. Thus, the claims that follow should not be construed as being limited to a particular DSL standard, or to particular twisted pair conductors.

In one example environment of use, the method and apparatus disclosed herein is utilized in a multi-channel communication system based on a DSL communication standard. As such, a discrete multi-tone transmission (DMT) scheme is utilized to maximize channel bandwidth and overcome processing challenges created by ISI. In one embodiment the method and apparatus described herein operates on each frequency bin. In one embodiment this comprises 256 different tones and the processing described herein may operate on each tone. In other embodiments a different number of tones may be utilized. While it is contemplated that time domain filters may be utilized for processing in the time domain, in the embodiment described herein processing occurs in the frequency domain.

Figure 2A:
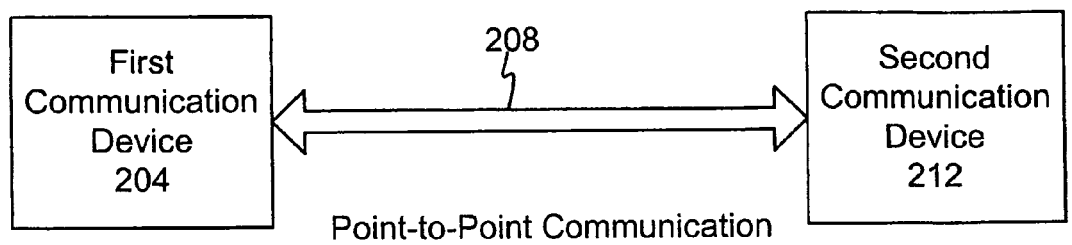
FIG. 2A illustrates a block diagram of an example embodiment of a point-to-point communication system.
Figure 2B:
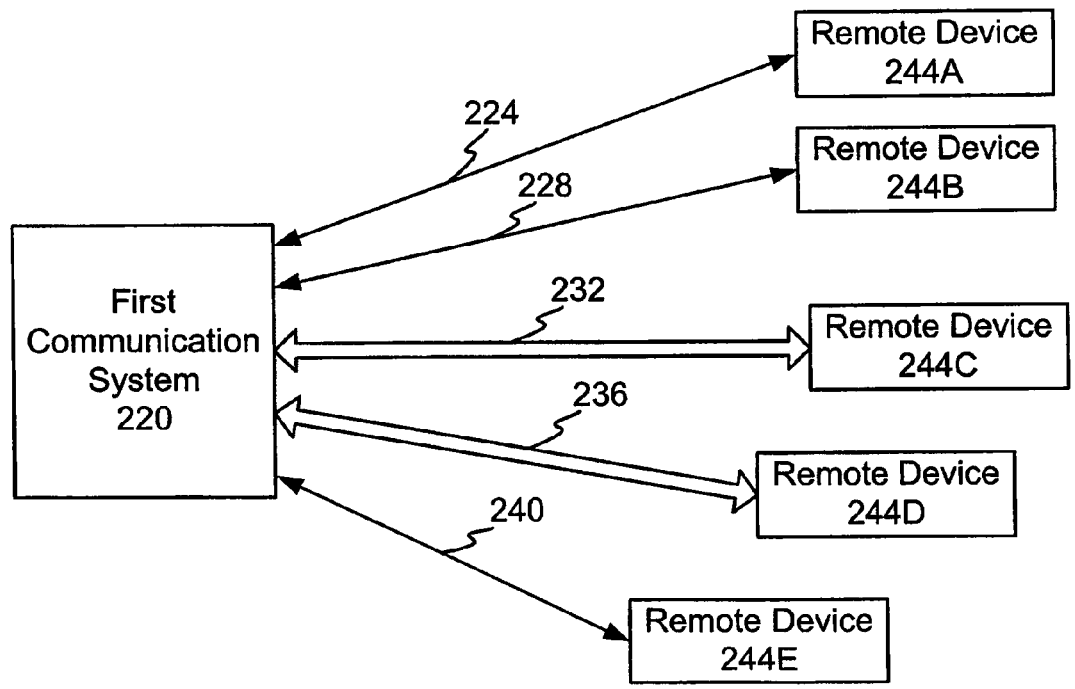
FIG. 2B illustrates a block diagram of an example embodiment of a point-to-multipoint communication system.

FIG. 2A and FIG. 2B illustrate two exemplary communication system configurations for use with the method and apparatus described herein. It is contemplated that the method and apparatus described herein may be applied to both point-to-point and point-to-multipoint communication systems and additional other communication system configurations as may be enabled by one or ordinary skill in the art.

FIG. 2A illustrates an example embodiment of a point-to-point communication system configuration. As shown a first communication device 204 communicates via a multi-channel communication path 208 with a second communication device 212. Through use of the multi-channel communication path and the processing as described herein, increased data transmit rates may be achieved, as compared to the prior art, while utilizing existing communication medium. It is contemplated that the Multi-channel path 208 may comprises a wired, such as metallic conductor or optic, path, or wireless or free space medium.

FIG. 2B illustrates an example embodiment of a point-to-multipoint communication system. As shown a first communication system 220 communicates with two or more remote devices 244A, 244B, 244C, 244D, 244E via the communication paths 224, 228, 232, 236, 240. In this example embodiment communication paths 224, 228 and 240 comprise single channel communication paths while paths 232, 236 comprise multi-channel communication paths. Examples of point-to-multipoint communication systems include, but are not limited to a wireless base station that communicates with multiple mobile transceivers. Another example comprises a DSL access multiplexer in a telephone central office communicating with multiple customer DSL modems in a star network using one pair per customer. In such a configuration, the disclosed invention can be practiced in a different manner in the upstream direction (remote devices to central system) and the downstream direction (central system to remote devices). In particular, in the upstream direction the disclosed invention can be practiced by the receiver of the central system and can operate on the received upstream signals. On the other hand, in the downstream direction, the invention can be practiced by the transmitter of the central system, and can operate on the signals prior to their transmission on the multichannel communication medium. To those skilled in the art, this is generally referred to as "transmitter pre-processing" of the communication signals. Of course, other configurations are possible that would likewise benefit from the teachings contained herein.

With regard to multi-channel communication path systems, multichannel communication systems have found application in situations where one can utilize multiple physical paths or channels from transmitter to receiver to convey information. Examples include wireless communication systems with multiple transmit and multiple receive antennas, gigabit Ethernet systems (using four copper pairs per link), and DSL multipair transmission systems, to name but a few. Through the use of multi-channel paths and the method and apparatus described herein, synergy exists in that the overall bandwidth or data rate possible with the multi-channel path and associated signal processing is greater than the sum of an equal number of single channel communication systems operating individually, such as in a multiplexed configuration. As a result, information is transmitted and processed, both prior to and after transmission, in a coordinated fashion across all channels to maximally utilize the available physical transmission medium. As a result of these benefits, the method and apparatus described herein exploits the multi-channel path environment.

Figure 3:
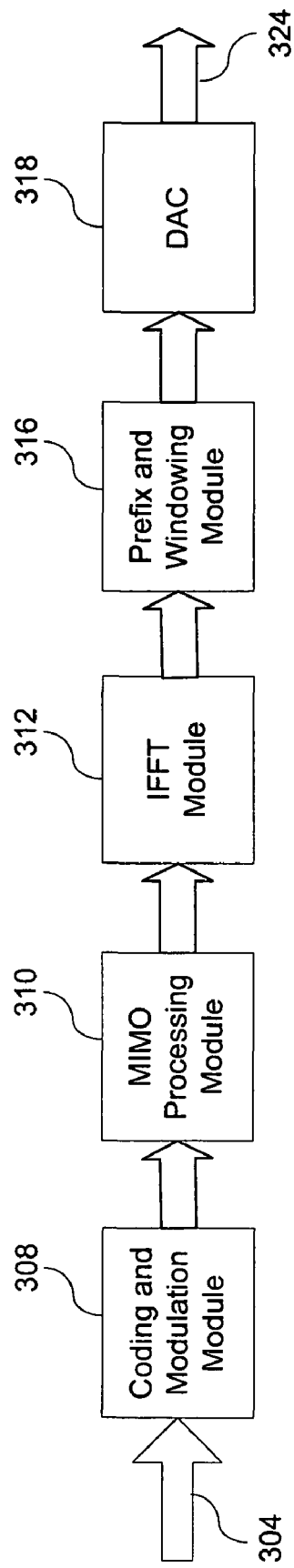
FIG. 3 illustrates a block diagram of an example embodiment of a transmitter.

Turning now to FIG. 3, a block diagram of an example embodiment of a transmitter is shown. Although it is contemplated that the principles described herein may be utilized with any transmission standard, modulation scheme, or encoding scheme, in this example embodiment a vectored DMT transmission system is adopted for use. The transmitter shown in FIG. 1 comprises a DMT transmission system in which a collection of all the signals to be transmitted from all the available channels are processed in sync, with synchronous clocks and frame aligned, through the DMT transmitter blocks as shown.

As stated above, the processing described herein may be utilized with any communication standard or scheme. Mitigation of intersymbol interference in a single channel (as well as multichannel) system may be accomplished by appropriate transmitter and receiver filtering (channel equalization). With regard to a DMT system, DMT modulation divides the available bandwidth in multiple parallel frequency channels (tones) and transmits information bits on each tone according to each tone's information capacity. DMT has the benefit of high performance and low complexity as compared to other prior art methods. For example, use of DMT may mitigate numerous intersymbol interference issues.

As shown an input 304 from a network device, computers, switch, or any communication or source device is received at a coding and modulation module 308 for processing in accordance with one or more coding and modulation schemes. In one embodiment the coding and modulation comprises such as may occur with DMT type coding and modulation. U.S. Pat. No. 5,673,290, which is incorporated by reference, provides general information and background regarding DMT type communication transmitters and processing. In one embodiment the output of the coding and modulation module 308 comprises a multi-channel path carrying 256 values which are represented as a magnitude and phase and which at this stage in the processing may be in the frequency domain. As DMT type coding and modulation is generally understood by one of ordinary skill in the art, it will not be described in detail herein. It should be noted that the input 304 to the coding and modulation module 308 may comprise a multi-conductor or multi-channel module and the number of channels associated therewith may be dependant upon the number of channels utilized for communication between remote locations and the particular design choices for of the system designers. The input 304 may also comprise a high speed serial input.

The output of the coding and modulation module 308 feeds into the MIMO processing module 310 and then into IFFT module 312 (inverse Fast Fourier Transform). In accordance with embodiments disclosed, MIMO processing module 310 processes the multiple inputs to negate or account for the channel matrix's effect on the channel and the noise v(n) so that the original signal may be recovered and performance requirements maintained. The IFFT module 312 processes the incoming data by performing an inverse Fast Fourier Transform on the incoming data. The transformed data is in turn provided to a prefix and windowing module 316 that is configured to append needed leading and trailing samples of a DMT symbol and other processed data. In one embodiment this comprises time domain multiplication of each real sample by a real amplitude that is the window height. This allows for a smooth interconnection of the samples, which in turn may decreases noise leakage across bins in the frequency domain. The output of the prefix and windowing module 316 is eventually received at one or more digital to analog converters 320 that transform the data into one or more analog signals, which are to be transmitted over one or more channels. It is contemplated that other or additional processing modules or systems may be included within the transmitter but which are not shown. It is also contemplated that the output channel 324 may comprise a plurality of channels, paths or conductors. As suggested above the output 324 may comprise two or more twisted pair conductors.

Figure 4:
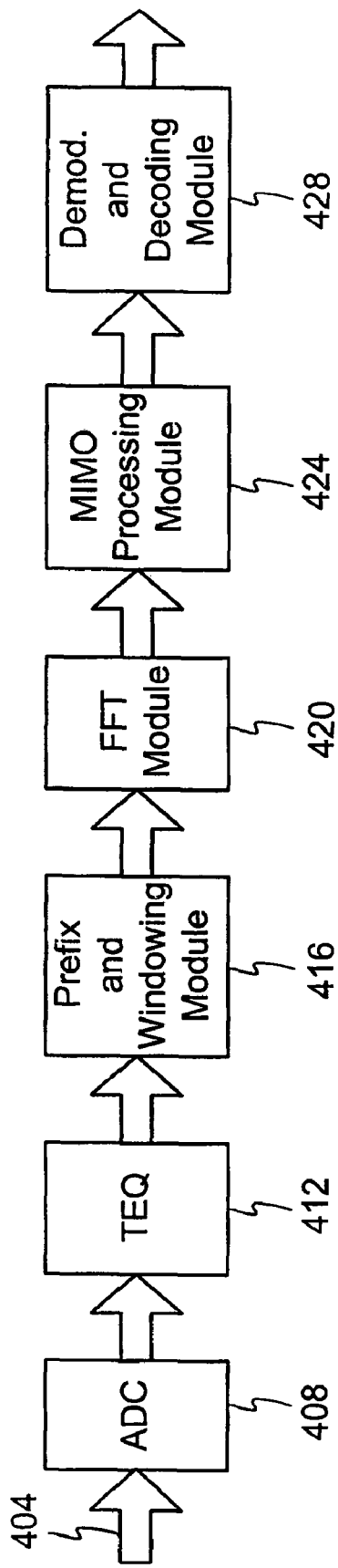
FIG. 4 illustrates a block diagram of an example embodiment of a receiver.

FIG. 4 illustrates a block diagram of an example embodiment of a receiver. The configuration of FIG. 4 is provided for purposes of discussion and not limitation as it is useful in understanding how the method and apparatus of the present invention relates to the other functional aspects of a receiver. As shown, an input 404 is configured to receive an input signal from a transmission medium or one or more intermediate devices that may reside between the transmission medium and the input, such as a transformer or other device. The transmission medium may comprise two or more physical channels. As it is contemplated that the receiver of FIG. 4 be utilized in a multi-channel environment, the input 404 may comprise a parallel line comprising numerous conductors or channels. Similarly, the devices shown in FIG. 4 and throughout this document may consist of one or more such devices as may be necessary to meet the processing requirements described herein. Thus, in the case of FIG. 4, if the channel 404 were to comprise twelve channels, then the ADC block 408 may comprise twelve individual ADC devices.

The input 404 provides one or more received signals to one or more analog to digital converters (ADC) 408 that convert the one or more incoming signals to a digital format for subsequent processing. Thereafter one or more a time domain equalizers (TEQ) 412 receive and process the one or more signals to reduce or negate the effects of transmission of the signal through the one or more channels. Any type equalization may occur.

After equalization, one or more prefix and windowing modules 416 perform an optional windowing and/or prefixing operation on the one or more signals as would be understood by one of ordinary skill in the art. After the optional windowing operation, one or more FFT modules 420 perform a Fourier Transform on the one or more signals. Any type Fourier Transform may occur including a Fast Fourier Transform operation. The FFT module 420 output(s) are provided to a multiple MIMO processing module 424 that is configured to receive the multiple inputs of the multi-channel input to the receiver and perform processing as is described below in greater detail. In the embodiment described therein, MIMO processing module 424 performs processing on the two or more signals to account for the affects of the channel and coupling that may have occurred during transmission. MIMO processing is described below in more detail. The processing that occurs prior to the MIMO processing module may be referred to herein as receiver pre-processing or simply pre-processing.

The output of the MIMO processing module 424 is provided to a de-modulation and decoding module 428 that is configured to de-modulate and decode the one or more received outputs from the MIMO processing module. In one embodiment the demodulation and decoding module 428 reverses the modulation and encoding performed by the transmitter if such was performed. In one embodiment this comprises QAM type modulation and encoding. It is also contemplated that error correcting coding type modulation may occur. In one embodiment, Trellis Coded Modulation may be used. In another embodiment, turbo coding or other coding schemes may be employed.

Thereafter, the one or more signals may be provided to one or more subsequent down stream systems for additional processing or for use by an end user or other system. In a multi-channel communication system each of the multiple channels in the communication system generates cross talk and, in addition, adjacent or nearby channels that are not part of the communication system, but instead associated with other communication systems, will also contribute crosstalk.

In one embodiment the output of the FFT module 420 comprises a total of 256 tones on each of fourteen physical channels or lines for each block, symbol, or register transfer. It is contemplated that the MIMO block 424 may jointly process all of the fourteen physical channels for each of the 256 tones. Thus processing may occur on one frequency at a time (fourteen channels) as the system cycles through the 256 frequencies, which represent the data. In various different embodiments a different number of channels may be used to provide the requested or desired bandwidth, i.e. data exchange capacity. Although any number of channels may be used, the range of four to sixteen channels may be selected in many applications.

Figure 5:
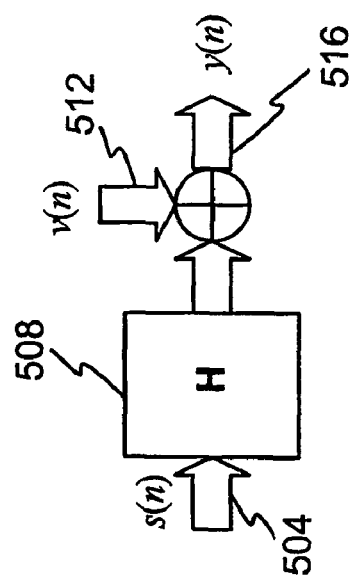
FIG. 5 illustrates a block diagram of a model of a channel with an input signal and an output signal.

FIG. 5 illustrates an example embodiment of a block diagram based on the mathematical model for the received signals at the output of the FFT module 420 or the input to the MIMO processing module 424. As shown in FIG. 5, a number, M, input signals for a particular bin n, shown as s(n) 504, are being acted upon by the channel, which may represented as an channel matrix 508 to account for the numerous interactions between self channel coupling. The addition of additive interference or noise, v(n) 512, corresponding to the input signals s(n) 504, is also shown to account for alien crosstalk. The resulting output, y(n) 516, represents a number, M, output signals for a particular bin n, that have passed through and been acted upon by the channel and signals on adjacent channels, i.e. both alien and self NEXT and FEXT. More simply, the signal y(n) 516 to be provided to the MIMO processing module 424 of FIG. 4 is generated by the transmission of the original signal through the channel where the signal on each of the two or more channels is acted upon by self crosstalk, represented by the channel matrix 508, and noise and alien crosstalk, represented by v(n) 512. In accordance with embodiments disclosed, MIMO processing module processes the multiple inputs to negate or account for the channel matrix's effect on the channel and the noise v(n) so that the original signal may be recovered and performance requirements maintained.

This can be shown mathematically by the following equation:

$$y(\omega_i) = H(\omega_i)s(\omega_i) + v(\omega_i)$$

where $H(\omega_i)$ represents the M×M FEXT channel matrix (assuming M parallel channels), $s(\omega_i) = [s_1(s_1(\omega_i), \ldots, s_M(\omega_i)]^T$ is the transmitted vector and $v(\omega_i)$ is the additive interference plus noise. Since $v(\omega_i)$ may be NEXT dominated, it is not assumed to be spatially white, but possesses a spatial correlation matrix $E\{v(\omega_i)v(\omega_i)^H\} = R_v$.

To reduce the complexity of the notation, in the text that follows, the explicit reference to frequency in the signal equations is dropped. This description illustrates that the impairments across lines are limited to within a particular bin, and therefore suggests that the MIMO processing block can operate on a bin by bin manner. A bin, as way of background, comprises a finite range of frequencies that is a subset of the entire available bandwidth. The available bandwidth may be divided into numerous bins and data transmitted within one or more of the bins to thereby segregate data transmission into the various and appropriate frequency bins. Thus, within the MIMO processing module 424 shown in FIG. 4, the crosstalk components that have coupled onto each channel may be accounted for so that the originally transmitted signals may be recovered.

Figure 6A:
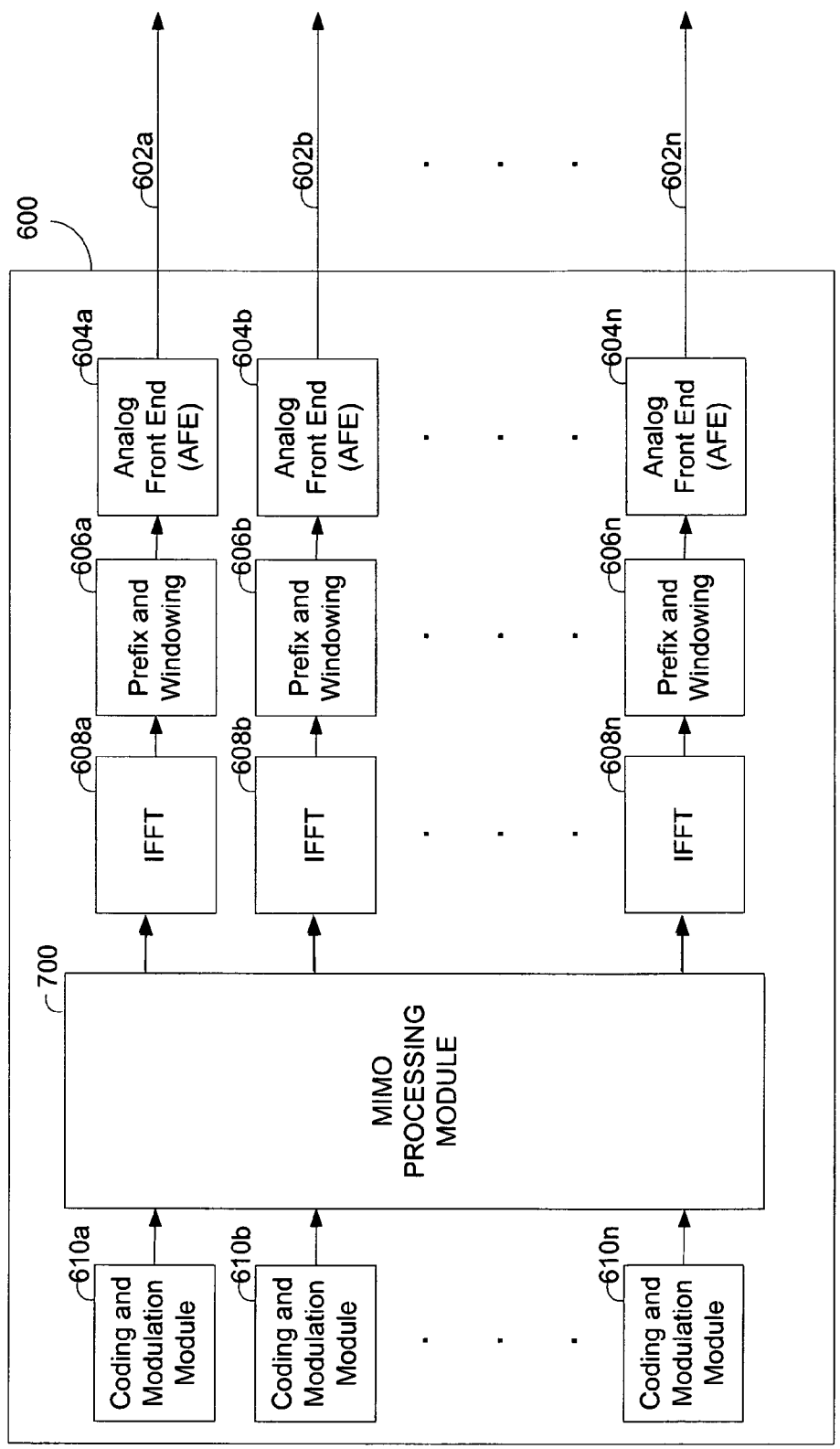
FIGS. 6A and 6B, illustrates block diagrams of a transmitter and receiver, respectively, and examples of components thereof, in accordance with one or more embodiments presently disclosed.
Figure 6B:
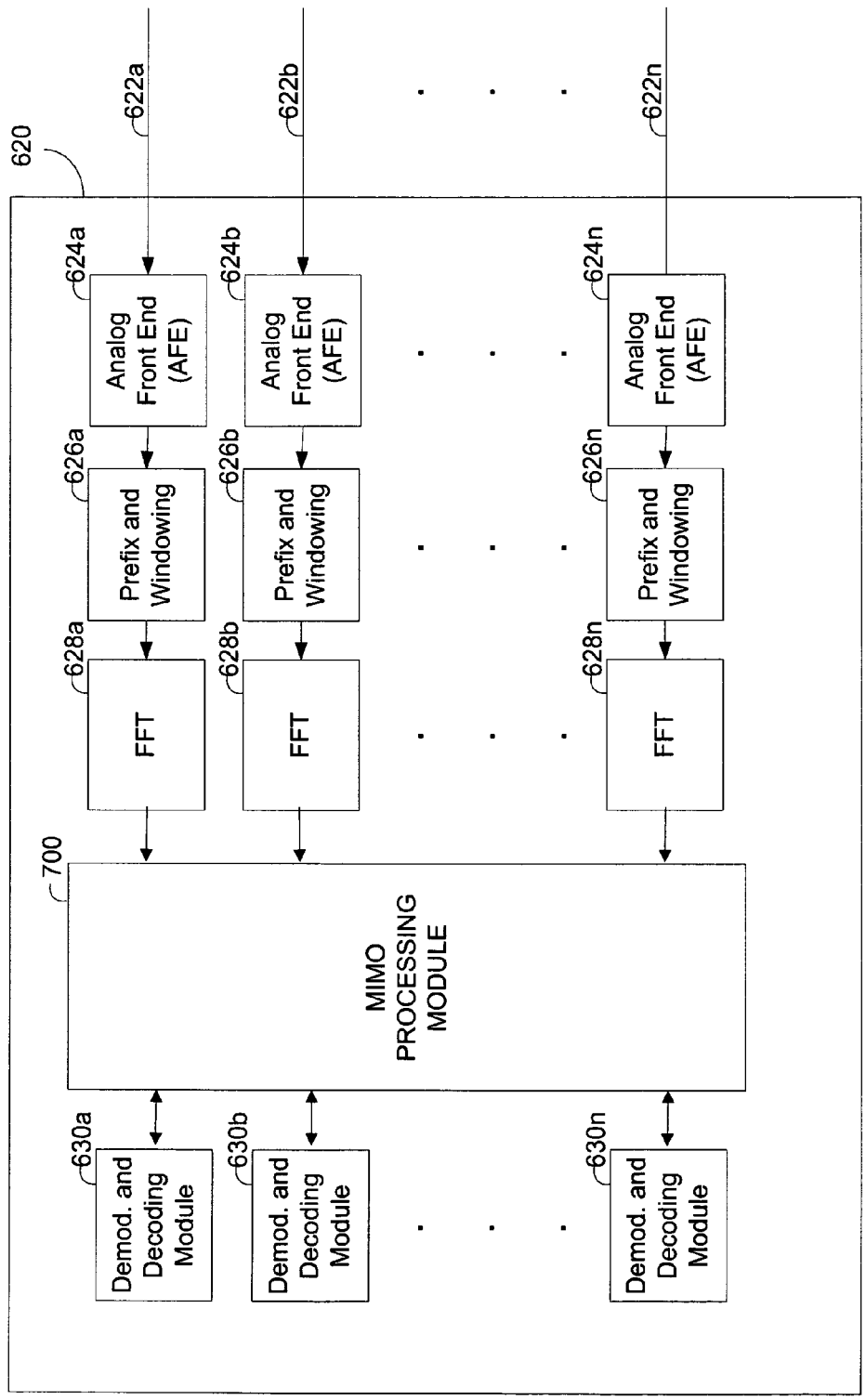

Referring again to FIGS. 3 and 4, block diagrams are shown illustrating a transmitter and receiver, respectively, each of which process multiple channels. The transmitter of FIG. 3 can process input from two or more channels, and the receiver shown in FIG. 4 can generate output for two or more channels, for example. FIG. 6, which comprises FIGS. 6A and 6B, illustrates block diagrams of a transmitter and receiver, respectively, and examples of components thereof, in accordance with one or more embodiments presently disclosed.

Referring to FIG. 6A, a block diagram of a transmitter is shown, which processes multiple channels and uses a MIMO processing module in accordance with one or more embodiments presently disclosed. Transmitter 600, which can be a DMT or OFDM transmitter for example, comprises a number of channels, a to n, each channel providing signal input to be processed by a corresponding coding and modulation module 610, IFFT module 608, prefix and windowing module 606 and AFE module 604. For a given channel, a to n, coding and modulation module processes a signal received from a device, such as a network device, computer, switch, etc., in accordance with one or more coding and modulation schemes. The output of the coding and modulation module 610 in input to MIMO module 700, which acts on the input to negate interface and recover the original signal. Channel output from the MIMO module 700 is fed to each of the respective IFFT modules 608, which processes the signal output by the MIMO module 700 and performs an inverse Fast Fourier Transform on the received signal. The transformed data is in turn provided to a prefix and windowing module 606, which processes the signal as discussed herein. The output of the prefix and windowing module 316 is received at one or more digital to analog converters 320 that transform the data into one or more analog signals, 602.

In accordance with one or more embodiments, MIMO module 700 operates in the frequency domain. In such a case, output from coding and modulation module 610 is in the frequency domain. In addition and in accordance with such embodiments, MIMO module 700 interrupts the signal chain of each transmitter after coding and modulation module 610 and prior to input to the IFFT module 608, and the signals corresponding to channels a to n are jointly processed and pre-compensated for crosstalk, or other interference, on a frequency bin (i.e., bin) by frequency bin basis before the signals are interjected back into the signal chain for further processing and transmission by transmitter 600.

FIG. 6B, illustrates a block diagram of a receiver which processes multi-channel input and uses a MIMO processing module in accordance with one or more embodiments presently disclosed. Receiver 620 receives input 622 from multiple channels, a to n. The input from each channel being processed by an analog front end (AFE) module, e.g., an ADC and TEQ 624, a prefix and windowing module 626, an FFT module 628, MIMO processing module 632, and a demodulator and decoding module 630. The output of each FFT module 628 is provided to MIMO processing module 632, which is configured to receive the multiple inputs of the multi-channel input to the receiver and perform to negate interference. The output of the MIMO processing module 632 is provided to each channel and its respective de-modulation and decoding module 630, which is configured to de-modulate and decode the one or more received outputs from the MIMO processing module. In one or more embodiments, the demodulation and decoding module 630 reverses the modulation and encoding performed by the transmitter if such was performed.

As shown in FIG. 6B, the signal from each channel, a to n, is intercepted by MIMO processing module 632, which operates on the signals from the channels a to n jointly and in the frequency domain on a bin by bin basis. In accordance with one or more embodiments, the MIMO processing module 632 of receiver 620 can use feedback regarding previous decision on other channels.

Figure 7A:
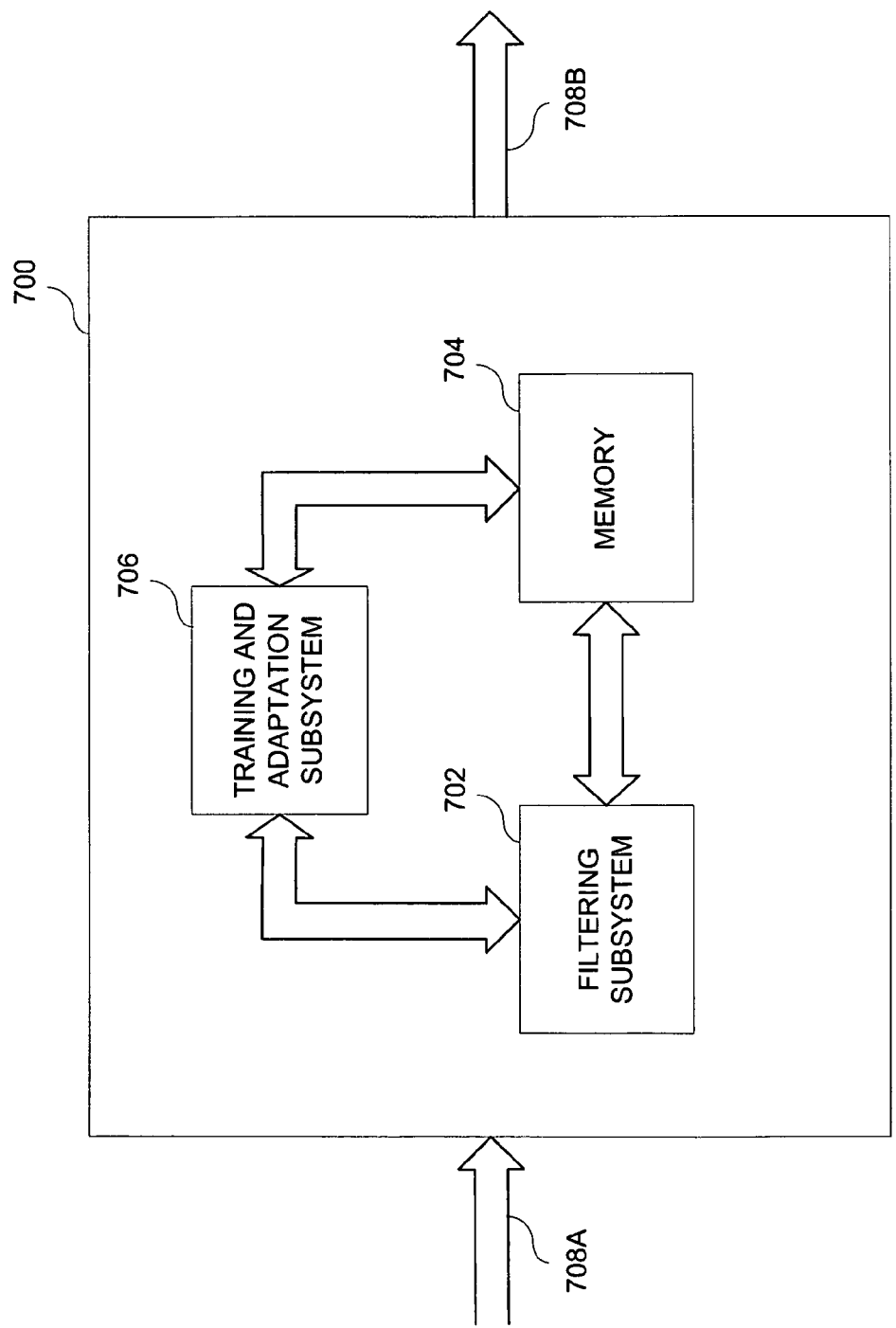
FIGS. 7A to 7D, illustrates exemplary block diagrams of a multiple input, multiple output (MIMO) unit, and components thereof, for use in accordance with one or more embodiments disclosed herein.

FIG. 7A provides an example of a block diagram of MIMO processing module 700, in accordance with one or more embodiments disclosed herein. The components shown, and any other components that compose MIMO processing module 700, can be implemented in hardware, software or a combination of hardware and software. In accordance with the non-limiting example shown, MIMO processing module 700 comprises a filtering subsystem 702, configured to filter the signals provided using filter coefficients stored in memory 704. In accordance with at least one embodiment, the filtering subsystem 702 can be implemented using a dedicated signal processor, for example. A training and adaptation subsystem 706 is configured to generate and update coefficients that are to be used by filtering subsystem 702. It is contemplated that training, adaptation, or both may occur on the coefficients to tailor the performance of any of the filters described herein to the particular needs of the system and to maintain performance, for example. In one embodiment the adaptation occurs in real time or periodically to maintain system performance and thereby adjust to changes in temperature, coupling, or other factors. The training and adaptation subsystem 706 can be implemented using a programmable digital signal processor, for example. A memory 704 is configured to store the coefficients generated/updated by training and adaptation subsystem and used by the filtering subsystem 702.

Interfaces 708A and 708B comprise a high speed communication path, such as a high speed bus, for providing input to, and output from, the MIMO processing module 700, respectively. For example, referring to FIGS. 6A and 6B, an interface 708A can be positioned between the coding and modulation module 610 of FIG. 6A, or the FFT 628 of FIG. 6B. The MIMO module 700, and the interface 708B can be positioned between the IFFT 608A of FIG. 6A, or the demodulating and decoding module 630 of FIG. 6B, and the MIMO module 700. In addition, the MIMO module 700 can exchange control information through a control interface (not shown), for use with MIMO training and adaptation, for example. By way of non-limiting example, control information can include transmission gain setting per frequency bin, signal to noise ratio per frequency bin, etc.

One or more embodiments of the present disclosure comprise a memory interface that compresses the filtering coefficients on the fly as they are written into memory, and correspondingly decompresses the coefficients as they are used by the filtering subsystem 702. In accordance with at least one embodiment, the filtering performed by the MIMO module 700 can operate in a predetermined manner sweeping through the frequency bins and retrieving the filtering coefficients in a sequential manner. Such embodiments take advantage of the fact that changes in coefficients from one frequency bin to a neighboring one may be small, since crosstalk coupling functions in most applications have a continuous frequency response such that the variability is not significant across neighboring frequency bins. Thus, it is possible to determine a filtering coefficient corresponding to a particular frequency bin given the filtering coefficient for a neighboring frequency bin and a difference, e.g., an estimated or actual difference, between the two filtering coefficients. Embodiments of the present disclosure gain efficiencies in storage, e.g., the amount of storage needed for the memory 704 and the transfer rates between the memory 704 and the filtering subsystem 702, as well as the memory 704 and the training and adaptation subsystem 706.

By way of a non-limiting example, given a filtering coefficient, $c_n$, which corresponds to a given frequency bin, n, a value of filtering coefficient, $c_{n+1}$, which corresponds to another frequency bin, n+1, can be expressed as:

$$C_{n+1} = C_n + e_{n+1}, \quad \text{Eq. (1)}$$

where $e_{n+1}$ comprises a difference, also referred to herein as an error prediction, between $c_n$ and $c_{n+1}$. Due to "smoothness" properties of neighboring filter coefficients, it is likely that $e_{n+1}$ will be a much smaller value that the value of the filtering coefficient $c_{n+1}$. Since the value is smaller, a fewer number of bits is needed to store $e_{n+1}$ as compared to $c_{n+1}$, and the amount of memory 704 needed to store filtering coefficients can thereby be reduced. Furthermore and in addition to efficiencies gained in storage, efficiencies can be gained in communicating $e_{n+1}$ in place of $c_{n+1}$.

There exist several prediction error compression methods based on Eq 1, like DPCM and others, and the details of the exact implementation are widely available in textbooks and known to the skilled in the art.

In accordance with one or more embodiments of the present disclosure, a compress/decompress read/write interface is used to compress and decompress filter coefficients. As discussed above, by way of a non-limiting example, compression can be achieved by determining a difference between a coefficient, $c_n$, and a neighboring coefficient, $c_{n+1}$, and decompression can be performed for a coefficient, $c^{n+1}$, using Eq. (1).

It should be mentioned here that Eq. (1) provides only a general idea of prediction error compression. The skilled in the art will understand that this process is iterative in always increasing values of index n. The skilled in the art will also understand that if the error term $e_{n+1}$ is only allowed to have a small number of bits, Eq (1) may only be an approximation. Therefore, the recursion of Eq (1) may use a true or approximate value of coefficient $C_n$, denoted as $\hat{C}_n$, and can take the form $$C_{n+1} = \hat{C}_n + e_{n+1} \quad \text{Eq. (1a)}$$

Figure 7B:
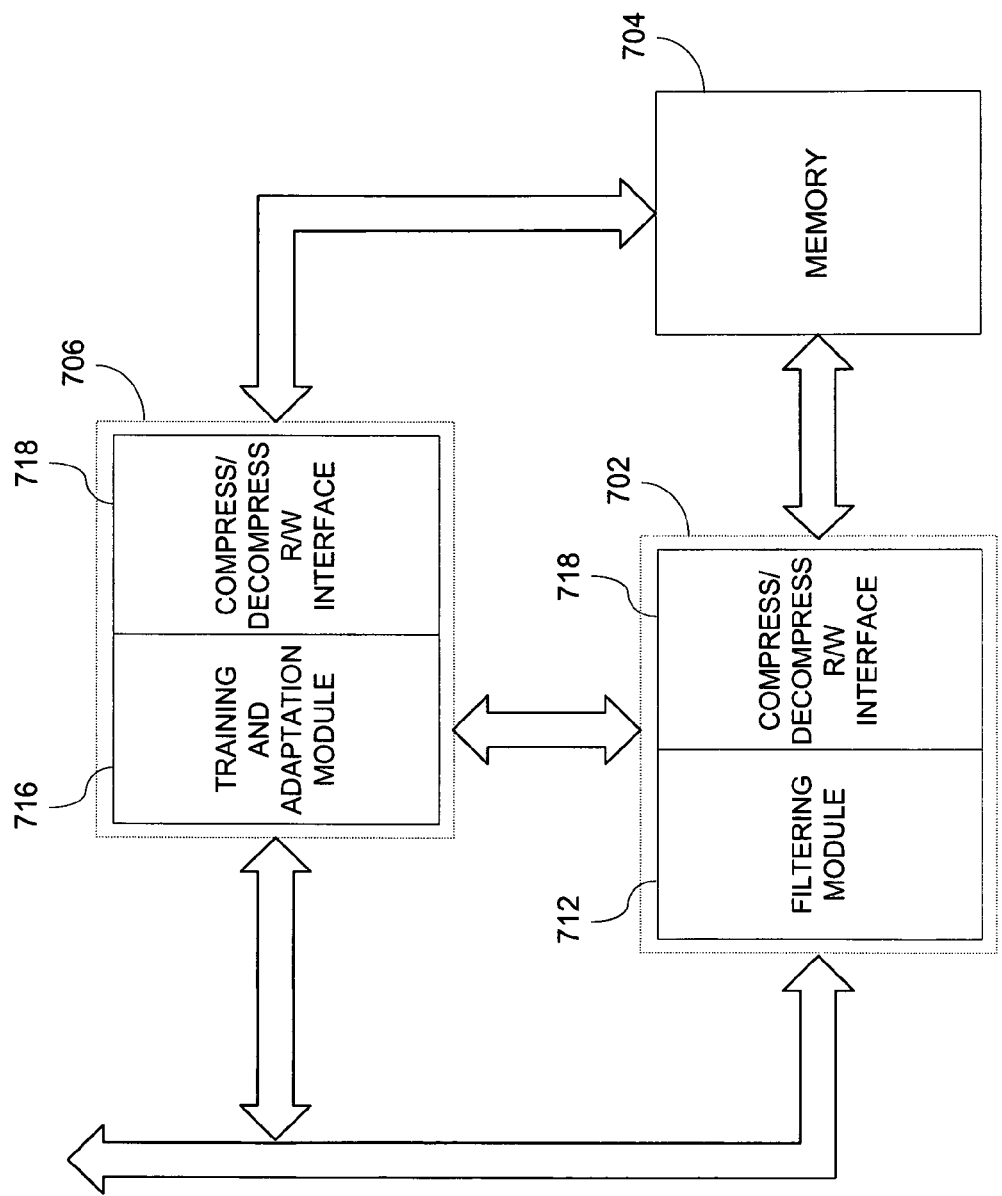

In accordance with one or more such embodiments, the filtering subsystem 702 and the training and adaptation subsystem 706 comprise an interface to the memory 704 configured to perform compression and decompression for a given coefficient, $c_{n+1}$, using coefficient, $c_n$, and the difference, $e_{n+1}$, and Eq. (1). More particularly and with reference to FIG. 7B, the filtering subsystem 702 comprises a filtering module 714 and interface 718, and a training and adaptation subsystem 706 comprises a training and adaptation module 716 and a interface 718.

Interface 718 can be used to determine a coefficient using a value for a previous coefficient and a determined prediction error for the current coefficient. For example, interface 718 can be used to reconstruct $c_2, C_3, \ldots, c_n$ by reading $e_2, e_3, \ldots, e_n$ based on an initial coefficient, $c_1$, using Eq. (1).

Conversely, interface 718 can be configured to generate an error, e, for a given coefficient using a variance of Eq. (1), such as that shown in Eq. (2) below, for example:

$$e_{n+1} = C_{n+1} - C_n,\qquad\text{Eq. (2)}$$

such that $e_{n+1}$ is the difference between coefficient values $c_{n+1}$ and $c_n$. If that difference is quantized to a small number of bits, Eq (2) is only an approximation, and the error is more accurately calculated as $$e_{n+1} = C_{n+1} - \hat{C}_n,\qquad\text{Eq. (2a)}$$

It should be apparent, however, that Eq. (2) is one example of a manner in which $e_{n+1}$ can be determined, and that other methods can be used to predict a differential between coefficients. In addition, any prediction method by which a given digital signal is predicted using a known, or estimated, values of one or more other digital signals now known or contemplated in the future can be used. In accordance with one or more embodiments, a generalized example of a formula for predicting a filter coefficient can be expressed as follows:

$$C_{n+1} = f(C_n, C_{n-1}, \ldots)$$

and a generalized example of a formula for determining an prediction error can be expressed as follows:

$$e_{n+1} = C_{n+1} - f(C_n, C_{n-1}, \ldots),$$

Figure 7C:
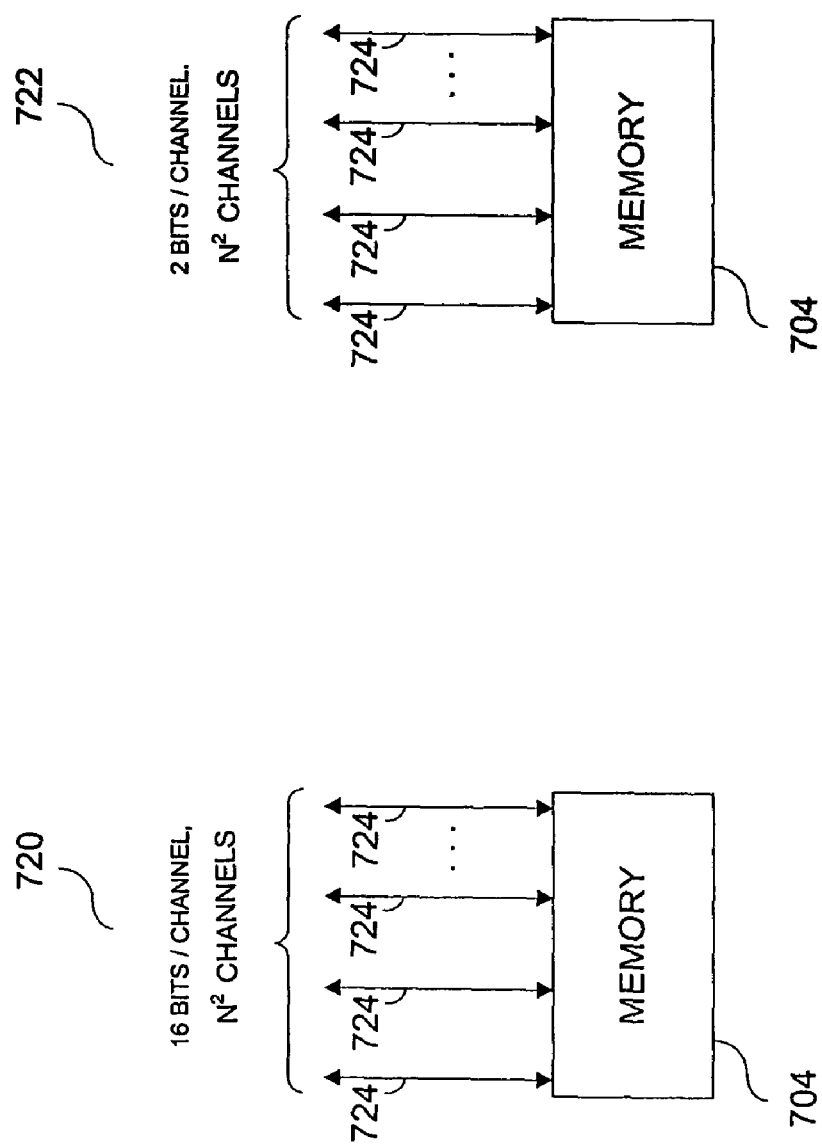

Reference is made to FIG. 7C, which provides examples of efficiencies that can be achieved using one or more embodiments presently disclosed. Referring to scenario 720 for example, a coefficient can comprise sixteen bits. In a case that there are $N^2$ channels 724, (corresponding to the $N^2$ coefficients per bin), the $N^2$ coefficients comprise $N^2*16$ bits. The process of retrieving the $N^2*16$ bits is repeated for each bin, and memory 704 stores $N^2*16$ bits for each bin. In accordance with one or more embodiments, however, by compressing all but an initial set of coefficients, it is possible to reduce the amount of memory 704 needed and increase the transfer rate to/from memory 704, for example. Referring to scenario 722, for example, in a case that a predicted error is stored in place of at least some of the coefficient values, which have a 16-bit representation, and the predicted error is 2 bits in length, a savings of 14 bits can be achieved in storage and transfer. Such a savings is multiplied across the number of bins for which the reduced coefficient representation, e.g., the prediction or error value, is used.

Figure 7D:
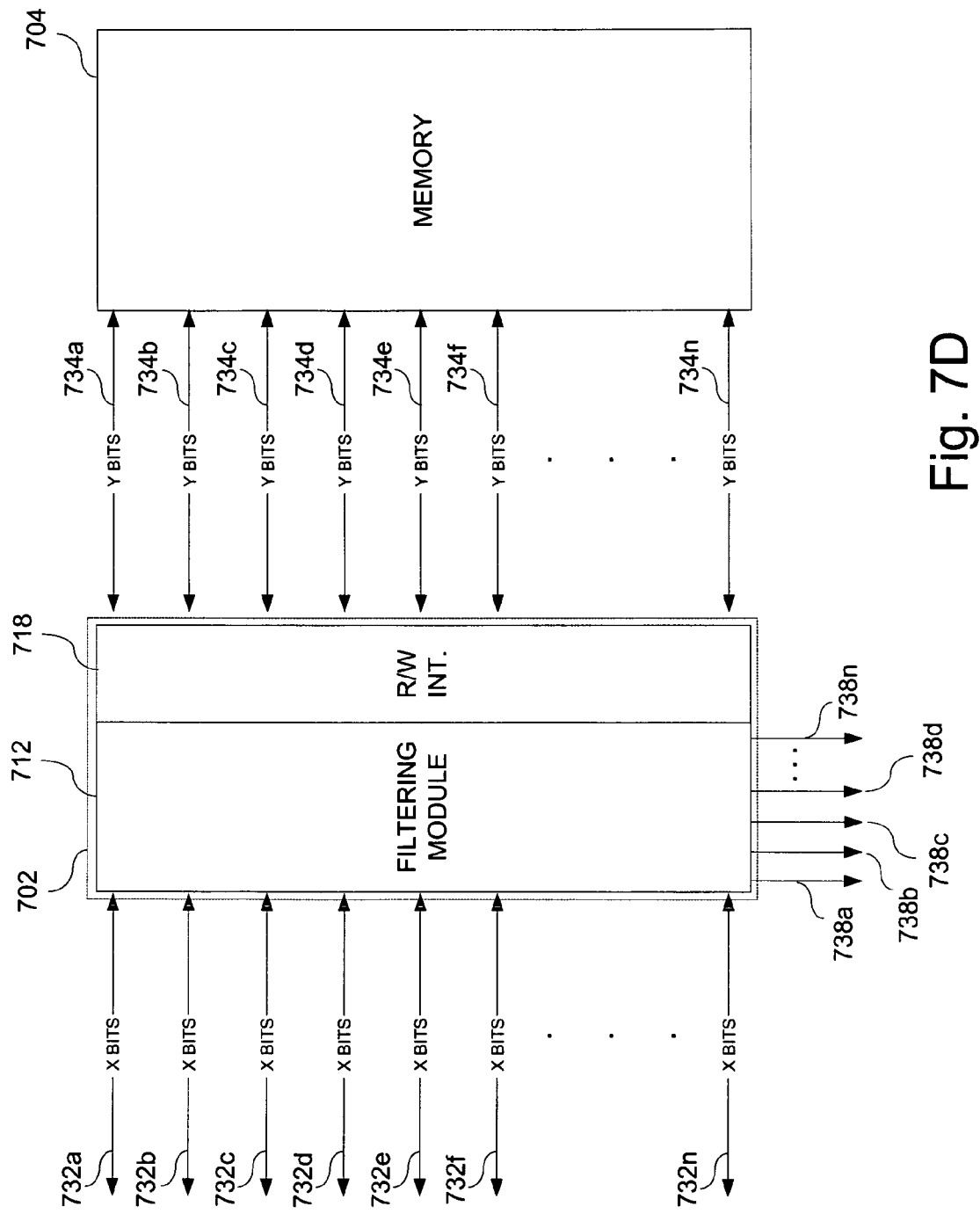

FIG. 7D provides an example of various input/output (I/O) of filtering subsystem 702 in accordance with one or more disclosed embodiments. As discussed, the filtering subsystem 702 comprises the filtering module 712 and the interface 718. The interface 718 may be configured to perform compression and/or decompression. The lines 732a to 732n can carry the input signals to the filtering subsystem 702. The value n may comprise any whole number. Each of the lines 732 can transfer any number of bits, x, e.g., 16 bits. The interface 718 of the filtering subsystem 702 fetches coefficients from, and outputs coefficients to, the memory 704 via the lines 734a to 734n. Each of the lines 734 can transfer any number of bits, y. In a case that the lines 734 transfer compressed coefficient values, y can be a number less than the number of bits needed to represent a coefficient. For example, in a case that a coefficient is represented using 16 bits, y has a value of 2 bits. The compressed coefficients transferred from the memory 704 via lines 734 are decompressed by the interface 718. The decompressed coefficients are then used by the filtering module 712 to filter the input signals received via lines 732. The filtered result is output from the filtering module 712 via the lines 738. In accordance with one or more embodiments the signal input received via the lines 732, the coefficients fetched from the memory 704 via the lines 734, and the filtered result output via the lines 738 correspond to a given frequency bin. The filtering subsystem 702 iteratively receives the signal input via the lines 732, the coefficients via the lines 734 and outputs the filtered result via the lines 738 on a bin-by-bin basis. By reducing the number of bits needed to represent the filter coefficients in accordance with embodiments of the present disclosure, efficiencies are achieved in the communication of these coefficients between the filtering subsystem 702, and in the storage of the coefficients in the memory 704.

For the sake of another non-limiting example, assume that there are 1000 frequency bins and that there are 4000 sets of tones per second. In such a case, there would be 4 million filtering operations per second, with each frequency bin having a set of filtering coefficients. By reducing the representation some number of the coefficients to a fraction of the size of the actual coefficient (e.g., one-eight in a case of a 16-bit to 2-bit reduction), it should be apparent that significant efficiencies, and that such efficiencies increase as the number of pairs, or matrices, increase.

Figure 8A:
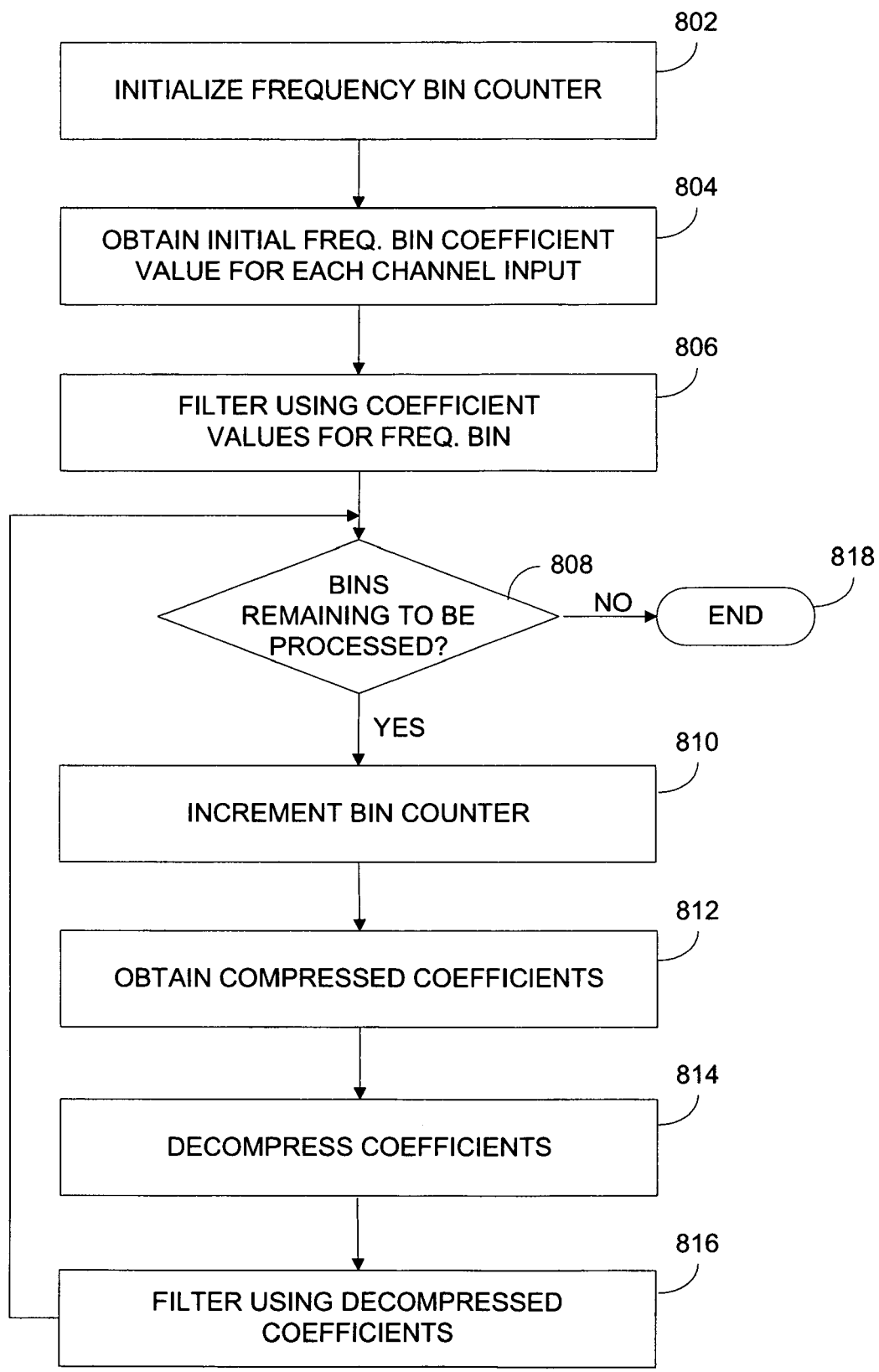
FIG. 8, which comprises FIGS. 8A and 8B, provides process flow examples for use in accordance with one or more embodiments presently disclosed.

Referring to FIG. 8A, an example flow diagram of a filtering process flow which uses compressed filtering coefficients for use in accordance with one or more disclosed embodiments is provided. The example process flow can be executed by filtering subsystem, for example. At step 802, a frequency bin counter is initialized to an initial frequency bin. At step 804, an initial coefficient value is obtained for each channel input. The coefficient values can be fetched from memory, for example. At step 806, the input for each channel corresponding to the initial frequency bin is filtered using the fetched bin coefficients, and the result is output. At step 808, a determination is made whether or not any bins remain to be processed. If not, processing ends at step 818. If any bins remain to be processed, processing continues at step 810 to increment the bin counter, and to obtain a set of compressed coefficient values, e.g., a predicted error value, at step 812. At step 814, the compressed coefficient values are decompressed. For example, a predicted error value for a given coefficient is added to a previous value of the given coefficient. At step 816, input for each channel corresponding to the current frequency bin is filtered using the decompressed filtering coefficients, and the filtered result is output. Processing continues at step 808 to process any remaining bins.

Figure 8B:
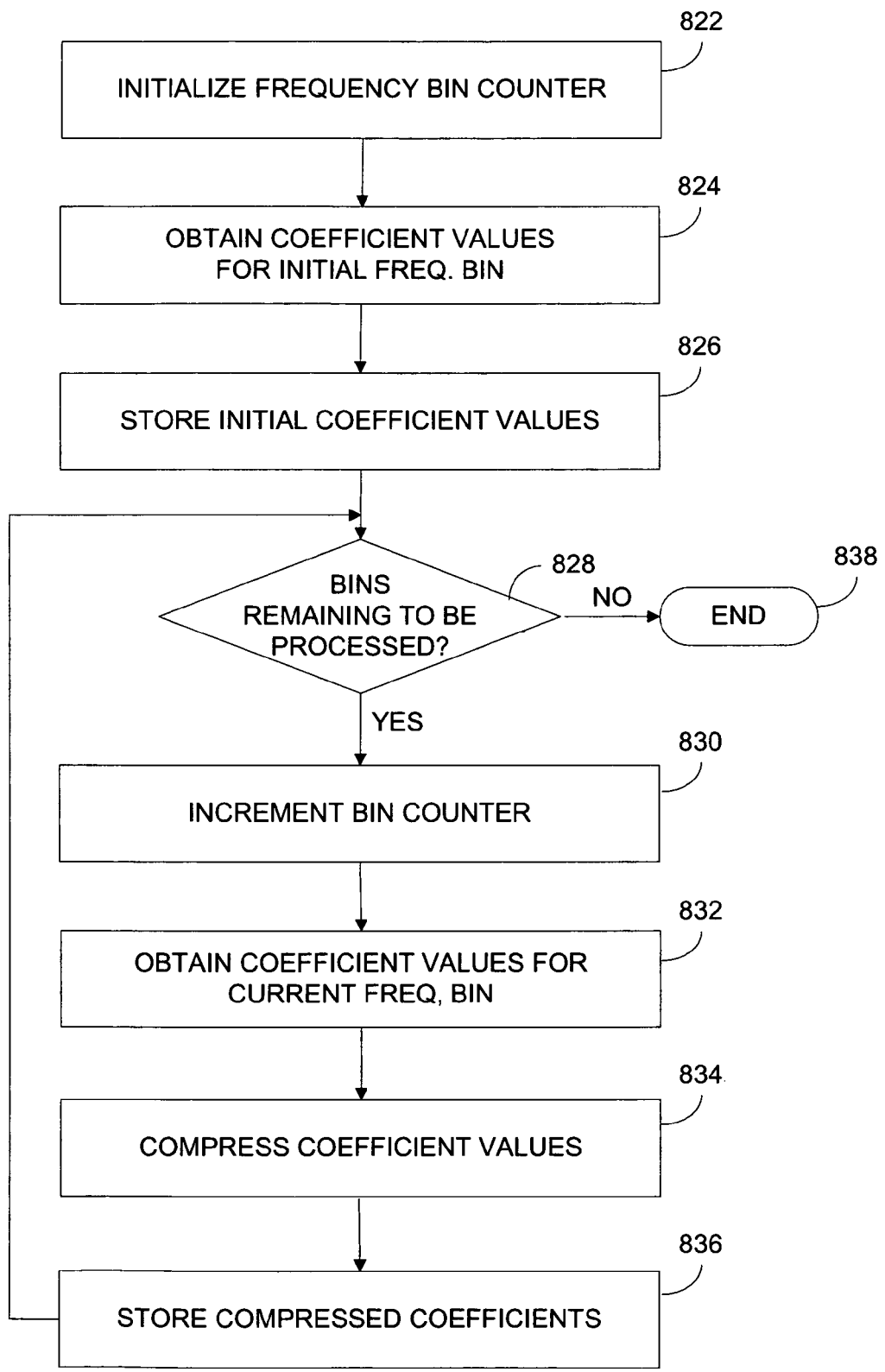

Referring to FIG. 8B, an example of a process flow for storing compressed filtering coefficients for use in accordance with one or more disclosed embodiments is disclosed. The example process flow can be implemented using training and adaptation subsystem, for example. At step 822, a frequency bin counter is initialized to an initial frequency bin. At step 824, a coefficient values are obtained for an initial frequency bin, and the initial coefficient values are stored, e.g., in memory. At step 828, a determination is made whether or not there are any frequency bins remaining to be processed. If not, processing ends at step 838, or the process can repeat for the next symbol. If there are bins remaining to be processed, processing continues at step 830. In the example shown in FIG. 8B, compressed values, or prediction error values, are determined using identified values for the coefficients corresponding to the current frequency bin. At step 834, the current bin's coefficient values are compressed based on the coefficient values corresponding to one or more previous frequency bins and the coefficient values of the current frequency bin. The compressed coefficients are stored at step 836.

In accordance with one or more embodiments, the coefficient values used in the process flows shown in FIGS. 8A and 8B can be actual or estimated coefficient values. For example, in a case of an estimated coefficient value, such value can be estimated using a prediction value associated with the coefficient.

Figure 9A:
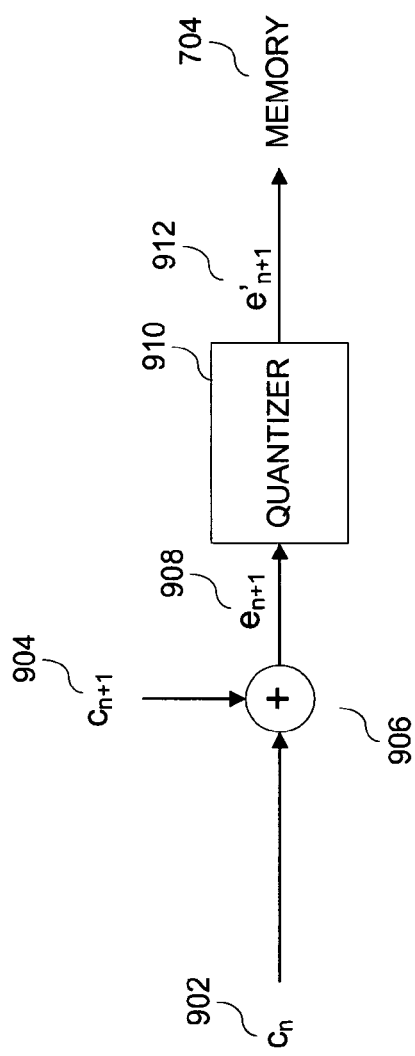
FIG. 9, which comprises FIGS. 9A and 9B, provides a component diagram illustrating compression performed by a MIMO processing module in accordance with one or more disclosed embodiments.
Figure 9B:
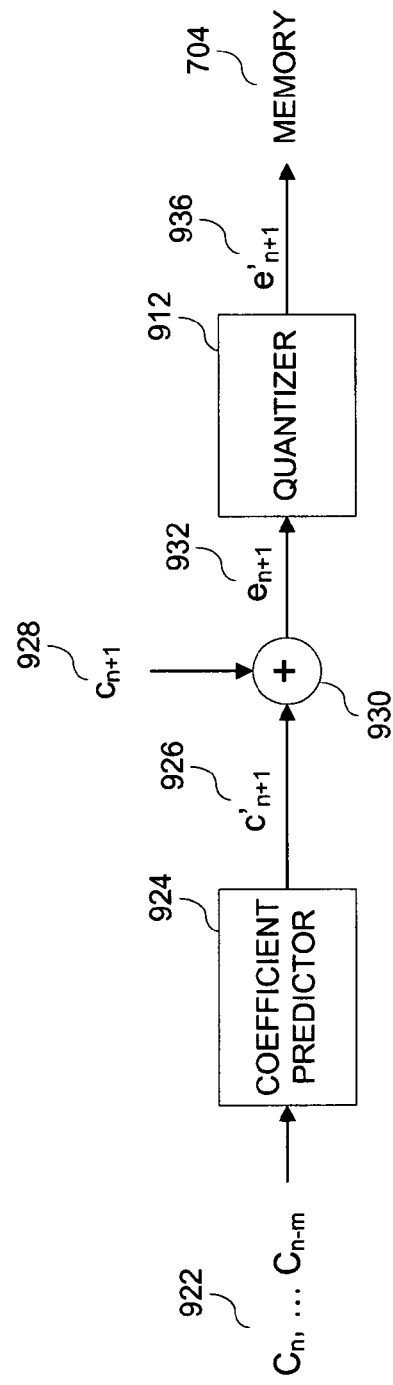

FIG. 9, which comprises FIGS. 9A and 9B, provides a component diagram illustrating compression performed by a MIMO processing module, e.g., interface 718, in accordance with one or more disclosed embodiments.

Referring to FIG. 9A, coefficient values, $C_{n+1}$ 904, and true or approximate coefficient values of $C_n$ 902, are input to an adder 906 to generate a prediction value, $e_{n+1}$. At this point, the prediction value 908 has the same precision, e.g., 16 bits, as the coefficient values. The prediction value 908 is input to quantizer 910 to generate a prediction value, $e'_{n+1}$, which is output and stored to memory 704.

In the example shown in FIG. 9A, actual or approximate (estimated) coefficient values can be used. Alternatively estimated values for some or all of the coefficient values can be used. In the example shown in FIG. 9B, a coefficient predictor 924 is used to generate an estimated coefficient value, $c'_{n+1}$. The coefficient predictor 924 use a number, m, coefficient values 922, which can be actual or estimated coefficient values, to predict the coefficient, $c'_{n+1}$, value 926. The estimated coefficient value 926 is input along with an actual value of the coefficient 928 to an adder 930 to generate a prediction error 932. As in FIG. 9A, a quantizer 912 may be used to generate a reduced-bit prediction value, $e'_{n+1}$, which is output and stored in the memory 704.

Figure 10A:
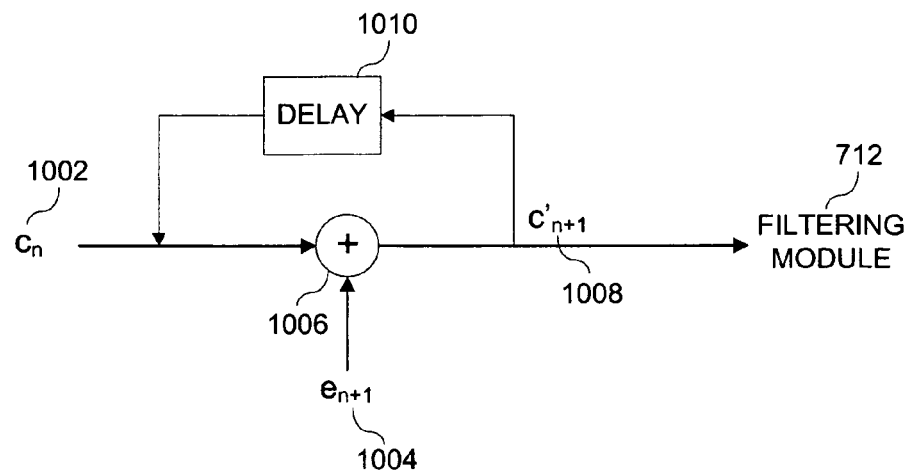
FIG. 10, which comprises FIGS. 10A and 10B, provides component diagram examples illustrating decompression performed by a MIMO processing module in accordance with one or more disclosed embodiments.
Figure 10B:
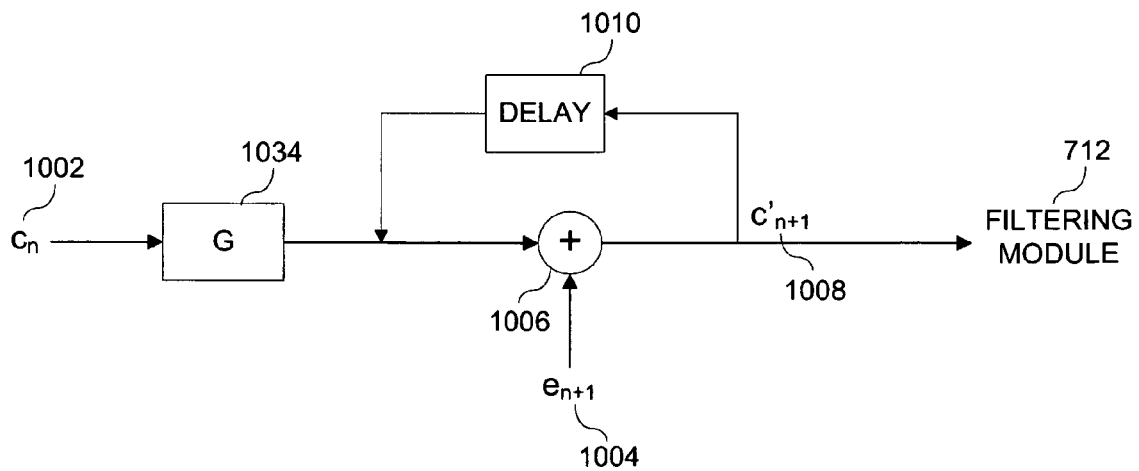

FIG. 10, which comprises FIGS. 10A and 10B, provides a component diagram which illustrates decompression performed by a MIMO processing module, e.g., interface 718, in accordance with one or more disclosed embodiments. Referring to FIG. 10A, to generate an estimated coefficient value 1008, a value of a previous actual or estimated coefficient 1002 is input to the adder 1006, together with a prediction value corresponding to coefficient value 1008. As can be seen, the output of the adder 1006, estimated coefficient value 1008, is input to the filtering module 712 and becomes coefficient value 1002 via delay 1010.

Referring to FIG. 10B, a block diagram similar to that shown in FIG. 10 is presented. In FIG. 10B, however, a filter component 1034 operates on the initial sequence of actual or estimated coefficient values prior to its input to the adder 1006, in this example.

Figure 11A:
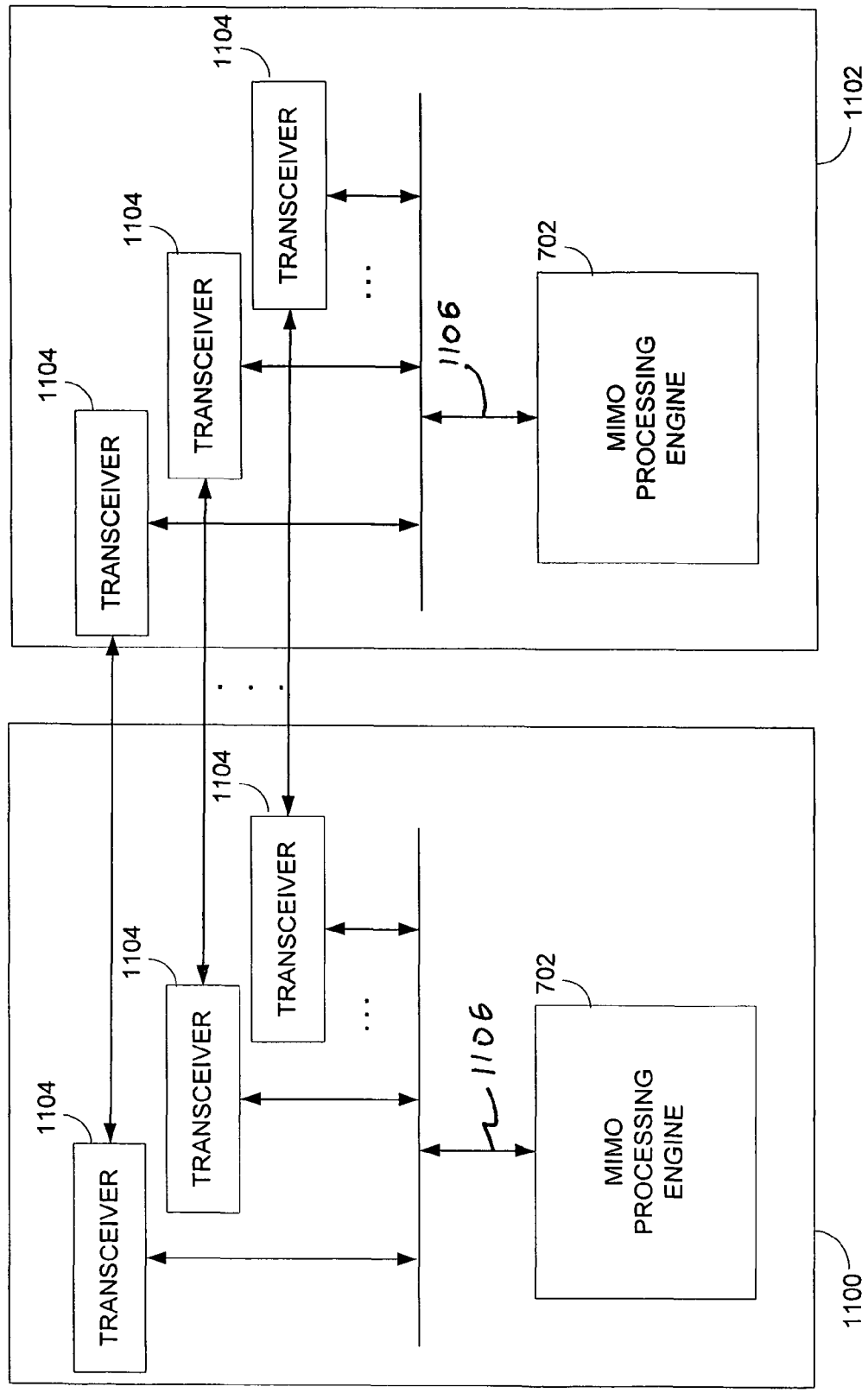
FIG. 11, which comprises FIGS. 11A and 11B, provides an example of multipair transceivers coupled to a MIMO processing module in accordance with one or more disclosed embodiments.
Figure 11B:
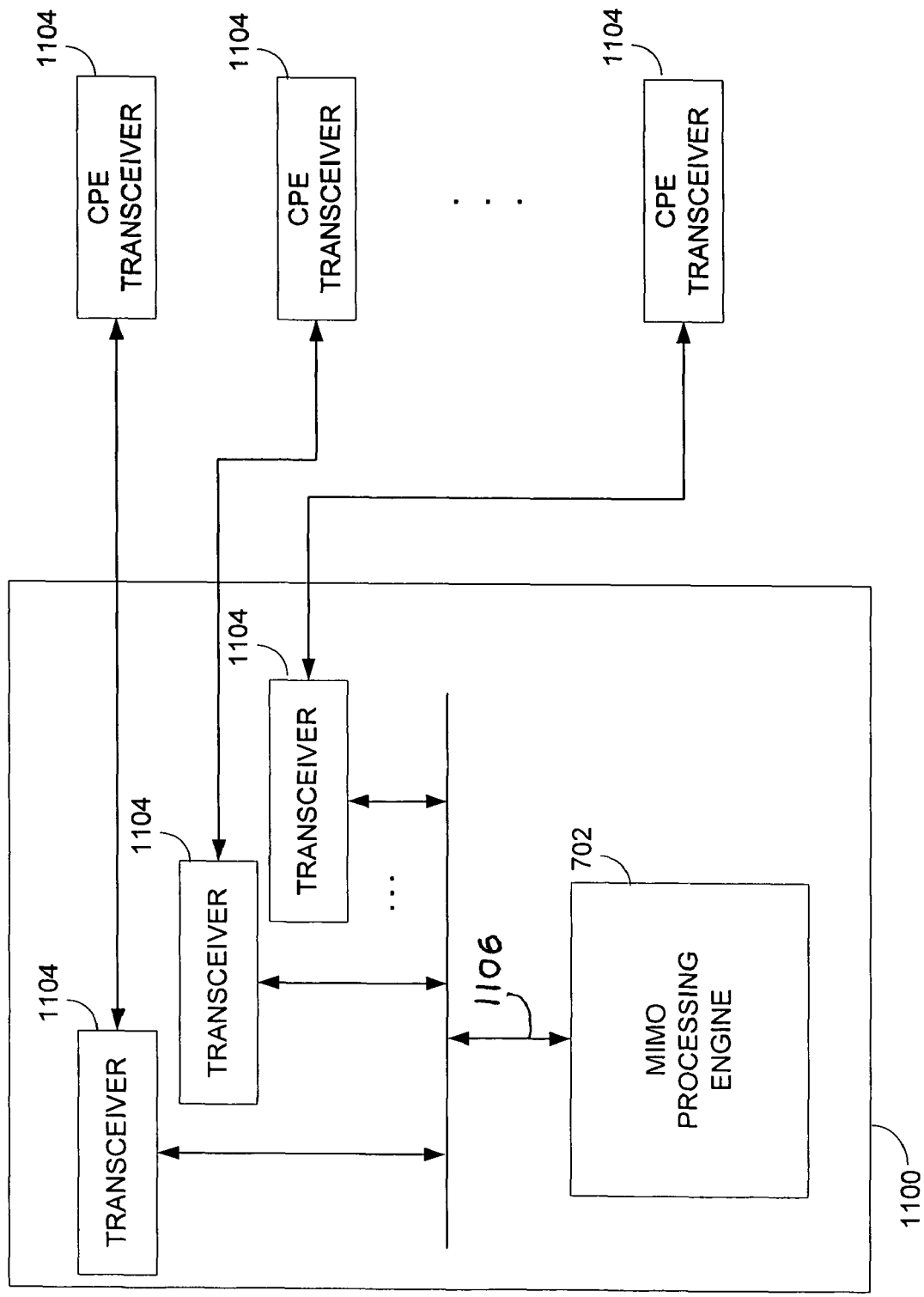

FIG. 11, which comprises FIGS. 11A and 11B, provides an example of multipair transceivers coupled to a MIMO processing engine 702 in accordance with one or more disclosed embodiments. In the example of FIG. 11A, a point-to-point multi-channel communication link is shown between a central office (CO) 1100 and customer premises equipment (CPE) 1102. In a wireline application, for example, this link can represent a copper Ethernet or DSL link over multiple copper pairs. In such a case, a high speed data stream is partitioned across multiple channels (copper pairs) for transmission, and reassembled at another node into its original form, for example. In a wireless application, the components shown can depict an N-transmit-by-N-receive multi-antenna system.

By way of a further non-limiting example, the link can comprise two modems, the CO 1100 or base station modem/transceiver and the remote equipment, or CPE 1102. The CO 1100 as well as the CPE transceivers 1104 have several signal processing blocks that are dedicated to each channel, with each transceiver comprising various components e.g., AFE, line amplifiers, equalizers, etc. The transceivers 1104 are coupled to MIMO processing engine 702 via a high-speed bus 1106, and a control interface (not shown). In accordance with at least one embodiment, the MIMO processing engine 702 processes data across all of the individual channels, as shown. The MIMO signal processing performed by MIMO engine 702 can be implemented in the transmitter signal chain, the receiver signal chain, or in both.

With reference to FIG. 11B, the MIMO-enabled transceiver of FIG. 11A is generalized for point-to-multipoint applications. In FIG. 11B, all channels terminate at the same transceiver 1104 at the CO 1100, and at CPE side each channel services a different customer. In the example shown, MIMO processing can be performed in the upstream direction (CPE to CO) on the receiver side, and MIMO processing in the downstream direction (CO to CPE) can be performed at the transmitter side.

Figure 12:
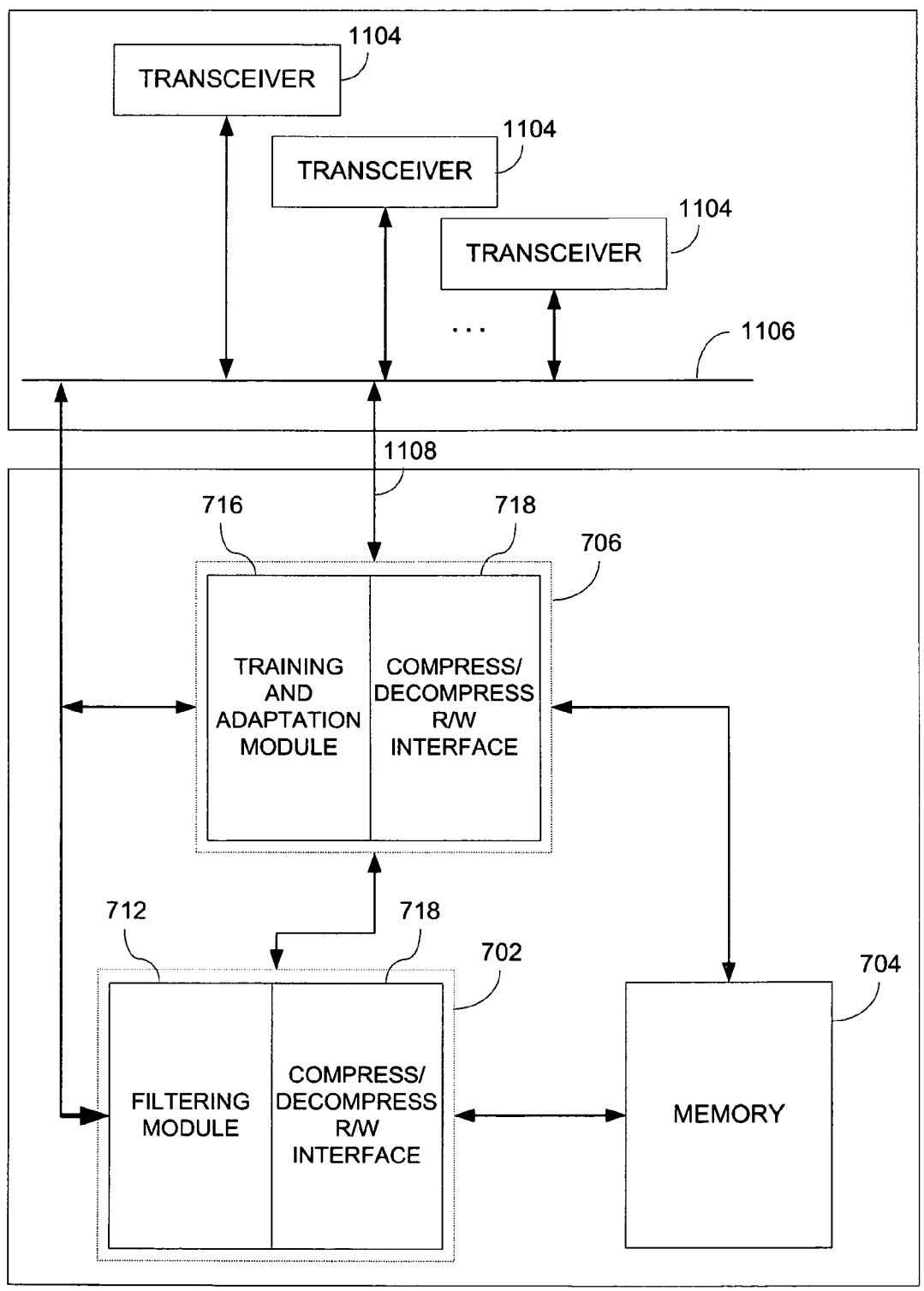
FIG. 12 provides an example of a MIMO processing module coupled to multiple transceivers in accordance with one or more disclosed embodiments.

FIG. 12 provides an example of a MIMO processing engine coupled to multiple transceivers in accordance with one or more disclosed embodiments. A high-speed bus 1106 can be used to communicate signals from channel input to the filtering subsystem 702, or the training and adaptation subsystem 706, or both. In addition, a control interface 1108 is shown and allows control information to be exchanged between the training and adaptation subsystem 706 and one or more of the transceivers 1104 via bus 1106.

While various embodiments of the invention have been described, it will be apparent to those of ordinary skill in the art that many more embodiments and implementations are possible that are within the scope of this invention.

What is claimed is:

1. A method of storing filter coefficients for use with a multiple input, multiple output filter which reduce memory required to store the filter coefficients comprising:
   storing a first set of coefficients in memory, the first set corresponding to a first frequency bin;
   compressing a second set of coefficients corresponding to a second frequency bin, wherein compression of the second set of coefficients is based at least in part on the first set of coefficients; and
   storing the second set of coefficients.

2. The method of claim 1, wherein compressing comprises calculating the difference, on a coefficient by coefficient basis, between the first set of coefficients and the second set of coefficients and quantizing the difference and only storing the difference as the second set of coefficients.

3. The method of claim 1, wherein compressing comprises calculating the difference, on a coefficient by coefficient basis, between a true or approximate value of the first set of coefficients and the second set of coefficients, quantizing the difference and only storing the difference as the second set of coefficients.

4. The method of claim 3, wherein a multiple input, multiple output filter processes signals over a large number of frequency bins in sequence in a DMT system, and compresses the corresponding filter coefficients in sequence.

5. The method of claim 1, further comprising;
   compressing a third set of coefficients corresponding to a third frequency bin, wherein compression of the third set of coefficients is based at least in part on the second set of coefficients; and
   storing the third set of coefficients.

6. The method of claim 5, wherein compressing comprises determining a difference, on a coefficient by coefficient basis, between the third set of coefficients and any function or combination of one or more prior coefficients.

7. A method of accessing filter coefficients for use with a multiple input, multiple output filter comprising:
   retrieving a set of first coefficients from memory;
   sequentially retrieving, on a bin by bin basis in a DMT system, a compressed set of second coefficients from memory, wherein the compressed set of second coefficients are stored in a compressed form; and decompressing the compressed set of second coefficients based at least in part on the set of first coefficients and the compressed sets of second coefficients to create a set of second coefficients.

8. The method of claim 7, wherein decompressing comprises adding, on a coefficient by coefficient basis, the set of first coefficients to the compressed set of second coefficients.

9. The method of claim 7, further comprising retrieving a compressed set of third coefficients from memory, wherein the compressed set of third coefficients are stored in a compressed form; and decompressing the compressed set of third coefficients based at least in part on the set of second coefficients and the compressed sets of third coefficients to create a set of third coefficients.

10. A method of filtering using a multiple input, multiple output filter comprising:

receiving two or more unfiltered signals for filtering by a multiple input, multiple output filter;

retrieving a set of coefficient prediction error values from a memory, each of which corresponds to a filter coefficient for use in filtering a set of input signals in the frequency domain;

generating a set of filter coefficients using the retrieved coefficient prediction error values;

filtering the two or more unfiltered signals using the generated set of filter coefficients within the multiple input, multiple output filter to create two or more filtered signals; and outputting the two or more filtered signals form the multiple input, multiple output filter.

11. The method of claim 10, further comprising processing the two or more filtered signals from the multiple input, multiple output filter to create two or more processed signals and transmitting the two or more processed signals over two or more channels to a remote terminal.

12. The method of claim 10, further comprising retrieving at least one filter coefficient upon which the set of filter coefficients are generated using the retrieved prediction error values.

13. The method of claim 10, wherein an amount of memory consumed by the set of coefficient prediction error values is less than an amount of memory consumed by the set of filter coefficients generated using the retrieved prediction error values.

14. The method of claim 10, wherein generating a set of filter coefficients using the retrieved coefficient prediction error values is accomplished via passing the coefficient prediction error values through a prediction filter.

15. The method of claim 10, wherein the method reduces the amount of data which must be retrieved from memory.

16. A filter coefficients storage and access system for use with a multiple input, multiple output filter comprising:

a storage subsystem configured to store a first set of coefficients in memory, the first set corresponding to a first frequency bin, and one or more additional values related or representing compressed coefficients;

an interface coupled to the storage subsystem and the multiple input, multiple output filter, the interface configured to:

retrieve the first set of coefficients from the storage subsystem;

provide the first set of coefficients to the multiple input, multiple output filter;

retrieve one or more additional values from the storage subsystem;

process the additional values and the first set of coefficient to create a second set of coefficients corresponding to a second frequency bin; and provide the second set of coefficient to the multiple input, multiple output filter.

17. The system of claim 16, further comprising a controller configured to coordinate timing between the interface and the multiple input, multiple output filter.

18. The system of claim 16, wherein processing comprises adding the additional values to the first set of coefficients.

19. The system of claim 16, wherein processing comprises decompressing.

20. The system of claim 16, wherein the interface further comprises communication paths between the storage subsystem and the interface.

21. A system for multiple input, multiple output filtering using coefficients, the system comprising:

a storage subsystem comprising a memory storing a set of coefficient prediction error values, each of which corresponds to a filter coefficient for use in filtering a set of input signals in the frequency domain;

a filtering subsystem coupled to the storage subsystem comprising:

an interface configured to retrieve the prediction error values from memory and to generate a set of filter coefficients using the retrieved prediction error values, wherein the filtering subsystem is configured to filter the input signals using the generated set of filter coefficients.

22. The system of claim 21, wherein generating the set of filter coefficients comprises decompressing the prediction error values.

23. The system of claim 21, wherein generating the set of filter coefficients comprises adding the prediction error values to another filter coefficient.

24. The system of claim 21, wherein the interface is separate from the filtering subsystem and is further configured to receive timing information from the filtering subsystem to coordinate the generating of filter coefficients and sending of filter coefficient to the filtering subsystem.

25. The system of claim 21, wherein the interface further comprises a quantizer configured to compress the prediction error values.

26. The system of claim 21, further comprising a training and adaptation module configured to update coefficient values and generate updated coefficient prediction error values for storage in the storage subsystem.

* * * * *